United States Patent
Araki

(10) Patent No.: US 12,061,419 B2
(45) Date of Patent: Aug. 13, 2024

(54) PLANOGRAPHIC PRINTING PLATE PRECURSOR AND METHOD OF PRODUCING PLANOGRAPHIC PRINTING PLATE

(71) Applicant: FUJIFILM Corporation, Tokyo (JP)

(72) Inventor: Kenjiro Araki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 1050 days.

(21) Appl. No.: 16/941,782

(22) Filed: Jul. 29, 2020

(65) Prior Publication Data

US 2020/0356008 A1 Nov. 12, 2020

Related U.S. Application Data

(63) Continuation of application No. PCT/JP2019/002583, filed on Jan. 25, 2019.

(30) Foreign Application Priority Data

Jan. 31, 2018 (JP) .................... 2018-015174

(51) Int. Cl.
*G03F 7/11* (2006.01)
*B41N 1/14* (2006.01)
*G03F 7/004* (2006.01)

(52) U.S. Cl.
CPC .................. *G03F 7/11* (2013.01); *B41N 1/14* (2013.01); *G03F 7/0045* (2013.01)

(58) Field of Classification Search
CPC ....................................................... G03F 7/11
See application file for complete search history.

(56) References Cited

U.S. PATENT DOCUMENTS

| | | | |
|---|---|---|---|
| 2002/0094490 A1 | 7/2002 | Endo et al. | |
| 2007/0287095 A1 | 12/2007 | Endo | |
| 2007/0287097 A1 | 12/2007 | Suzuki et al. | |
| 2008/0072780 A1 | 3/2008 | Sonokawa et al. | |
| 2009/0047601 A1* | 2/2009 | Iwai | B41C 1/1008 430/285.1 |
| 2009/0087780 A1 | 4/2009 | Kanchiku et al. | |
| 2009/0110887 A1* | 4/2009 | Sanada | B41C 1/1016 430/283.1 |
| 2009/0297831 A1 | 12/2009 | Mori | |
| 2010/0248138 A1 | 9/2010 | Mori | |
| 2011/0091814 A1* | 4/2011 | Endo | G03F 7/033 430/302 |
| 2013/0323643 A1 | 12/2013 | Balbinot et al. | |
| 2014/0242517 A1 | 8/2014 | Igarashi et al. | |
| 2016/0339730 A1 | 11/2016 | Wariishi et al. | |

FOREIGN PATENT DOCUMENTS

| | | | |
|---|---|---|---|
| CN | 1326861 A | 12/2001 | |
| CN | 101086621 A | 12/2007 | |
| CN | 101218108 A | 7/2008 | |
| CN | 101261446 A | 9/2008 | |
| CN | 101467101 A | 6/2009 | |
| CN | 101689022 A | 3/2010 | |
| CN | 101981507 A | 2/2011 | |
| CN | 105027004 A | 11/2015 | |
| CN | 105960335 A | 9/2016 | |
| EP | 1106347 A1 | 6/2001 | |
| EP | 1832928 B1 * | 4/2010 | ........... B41C 1/1016 |
| EP | 2 778 782 A1 | 9/2014 | |
| JP | 2006-035446 A | 2/2006 | |
| JP | 2008-080644 A | 4/2008 | |
| JP | 2008-276167 A | 11/2008 | |
| JP | 2009-073089 A | 4/2009 | |
| JP | 2009-229944 A | 10/2009 | |
| JP | 2009-294351 A | 12/2009 | |
| JP | 2010-228356 A | 10/2010 | |
| JP | 2012-139921 A | 7/2012 | |
| JP | 2014-081528 A | 5/2014 | |
| JP | 2015-519610 A | 7/2015 | |
| WO | 2008/084645 A1 | 7/2008 | |
| WO | 2015/046298 A1 | 4/2015 | |

OTHER PUBLICATIONS

International Search Report dated Mar. 19, 2019, issued by the International Searching Authority in application No. PCT/JP2019/002583.
Written Opinion dated Mar. 19, 2019, issued by the International Searching Authority in application No. PCT/JP2019/002583.
International Preliminary Report on Patentability dated Aug. 4, 2020, issued by the International Bureau in application No. PCT/JP2019/002583.
Communication dated Feb. 2, 2021, from the European Patent Office in European Application No. 19748430.6.
Communication dated Jun. 21, 2021, from the China National Intellectual Property Administration in application No. 201980010741.9.

* cited by examiner

*Primary Examiner* — Chanceity N Robinson
(74) *Attorney, Agent, or Firm* — Sughrue Mion, PLLC

(57) ABSTRACT

A planographic printing plate precursor having an image recording layer on a support, and an overcoat layer in this order, in which the overcoat layer includes particles, the overcoat layer is an outermost layer, and an occupation area ratio of the particles in a surface of the overcoat layer is 30% by area or more; and a method of producing a planographic printing plate obtained by using the planographic printing plate precursor.

11 Claims, No Drawings

PLANOGRAPHIC PRINTING PLATE PRECURSOR AND METHOD OF PRODUCING PLANOGRAPHIC PRINTING PLATE

CROSS-REFERENCE TO RELATED APPLICATIONS

This application is a continuation application of International Application No. PCT/JP2019/002583, filed Jan. 25, 2019, the disclosure of which is incorporated herein by reference in its entirety. Further, this application claims priority from Japanese Patent Application No. 2018-015174, filed Jan. 31, 2018, the disclosure of which is incorporated herein by reference in its entirety.

BACKGROUND OF THE INVENTION

1. Field of the Invention

The present disclosure relates to a planographic printing plate precursor and a method of producing a planographic printing plate.

2. Description of the Related Art

A planographic printing plate typically consists of a lipophilic image area which receives ink and a hydrophilic non-image area which receives dampening water, in the printing process. Planographic printing is a method of printing an image by setting a lipophilic image area of a planographic printing plate as an ink receiving unit and a hydrophilic non-image area of the planographic printing plate as a dampening water receiving unit (ink non-receiving unit) using the property in which water and oily ink repel each other, causing a difference in adhesiveness of ink to the surface of the planographic printing plate, allowing the ink to be impressed only on an image area, and transferring the ink to a printing medium such as paper.

Currently, in a plate-making step of producing a planographic printing plate from a planographic printing plate precursor, image exposure has been performed using a computer-to-plate (CTP) technology. That is, the image exposure is performed by directly scanning and exposing a planographic printing plate precursor using a laser or a laser diode without using a lith film.

In addition, with a growing interest in the global environment, environmental issues related to a waste liquid associated with wet treatments such as a development treatment have been highlighted in regard to plate-making for a planographic printing plate precursor. Along with this, it is desired to simplify the development treatment or not to perform the development treatment. As one of a simple development treatment, a method referred to as an "on-press development" has been suggested. The on-press development is a method of image-exposing a planographic printing plate precursor, attaching the planographic printing plate precursor to a printing press without performing a wet development treatment in the related art, and then removing a non-image area of an image recording layer at an initial stage of a typical printing step.

As the planographic printing plate precursor of the related art, a planographic printing plate precursor described in JP2008-080644A, JP2012-139921A, WO2008/0864645A, and JP2015-519610A has been known.

SUMMARY OF THE INVENTION

After exposure, a planographic printing plate precursor is developed and treated in order to remove a non-image portion of an image recording layer. The planographic printing plate precursor is typically designed such that a water-soluble overcoat layer or a water-soluble oxygen-impermeable barrier layer is disposed on the image recording layer. This water-soluble overcoat layer is used to improve sensitivity of the image recording layer.

There is a case where, since such a planographic printing plate precursor typically has the water-soluble overcoat layer, hydrophilicity of the surface of the planographic printing plate is increased and impressing property of ink is not sufficient.

In addition, the present inventor has found that, in a case where a mat layer in the related art is formed on the planographic printing plate precursor, a lot of development scum is generated and development scum-suppressing property is not sufficient.

An object to be achieved by an embodiment of the present disclosure is to provide a planographic printing plate precursor which has excellent impressing property and development scum-suppressing property.

An object to be achieved by another embodiment of the present disclosure is to provide a method of producing a planographic printing plate obtained by using the planographic printing plate precursor.

The methods for achieving the above-described objects include the following aspects.

<1> A planographic printing plate precursor comprising:
an image recording layer on a support; and
an overcoat layer in this order,
in which the overcoat layer includes particles,
the overcoat layer is an outermost layer, and
an occupation area ratio of the particles in a surface of the overcoat layer is 30% by area or more.

<2> The planographic printing plate precursor according to <1>
in which the overcoat layer further includes a water-soluble polymer.

<3> The planographic printing plate precursor according to <1> or <2>,
in which the particles are water-dispersible particles.

<4> The planographic printing plate precursor according to any one of <1> to <3>,
in which a volume average particle diameter of the particles is smaller than 0.1 μm.

<5> The planographic printing plate precursor according to any one of <1> to <4>,
in which the volume average particle diameter of the particles is smaller than an average film thickness of the overcoat layer.

<6> The planographic printing plate precursor according to any one of <1> to <5>,
in which the particles are at least one kind of particle selected from the group consisting of acrylic resin particles, styrene acrylic resin particles, silica particles, alumina particles, and urethane resin particles.

<7> The planographic printing plate precursor according to any one of <1> to <6>,
in which the particles are at least one kind of particle selected from the group consisting of acrylic resin particles and styrene acrylic resin particles.

<8> The planographic printing plate precursor according to any one of <1> to <7>,
in which the planographic printing plate precursor is a planographic printing plate precursor for on-press development.

<9> A method of producing a planographic printing plate comprising:
a step of image-wise exposing the planographic printing plate precursor according to any one of <1> to <8> to form an exposed area and an unexposed area; and
a step of supplying at least one of printing ink or dampening water to remove a non-image area.
<11> A method of producing a planographic printing plate comprising:
an exposure step of image-wise exposing the planographic printing plate precursor according to any one of <1> to <7> to form an exposed area and an unexposed area; and
a development step of supplying a developer having a pH of 2 or higher and 11 or lower to remove the unexposed area.

According to an embodiment of the present disclosure, it is possible to provide a planographic printing plate precursor which has excellent impressing property and development scum-suppressing property.

Furthermore, according to another embodiment of the present disclosure, it is possible to provide a method of producing a planographic printing plate obtained by using the planographic printing plate precursor.

DESCRIPTION OF THE PREFERRED EMBODIMENTS

Hereinafter, the contents of the present disclosure will be described in detail. The description of constituent elements below is made based on representative embodiments of the present disclosure in some cases, but the present disclosure is not limited to such embodiments. In the present specification, the numerical ranges shown using "to" indicate ranges including the numerical values described before and after "to" as a lower limit value and an upper limit value.

In numerical ranges described in stages in the present specification, an upper limit value or a lower limit value described in one numerical range may be replaced with an upper limit value or a lower limit value of a numerical range described in another stage. In addition, in the numerical ranges described in the present specification, the upper limit value or the lower limit value of the numerical ranges may be replaced with the values shown in examples.

In addition, in a case where substitution or unsubstitution is not noted in regard to the notation of a "group" (atomic group) in the present specification, the "group" includes not only a group not having a substituent but also a group having a substituent. For example, the concept of an "alkyl group" includes not only an alkyl group not having a substituent (unsubstituted alkyl group) but also an alkyl group having a substituent (substituted alkyl group).

In the present specification, the concept of "(meth)acryl" includes both of acryl and methacryl, and the concept of "(meth)acryloyl" includes both of acryloyl and methacryloyl.

In addition, the term "step" in the present specification indicates not only an independent step but also a step which cannot be clearly distinguished from other steps as long as the intended purpose of the step is achieved.

In addition, in the present disclosure, "% by mass" has the same definition as that for "% by weight", and "part by mass" has the same definition as that for "part by weight".

In addition, in the present disclosure, a combination of two or more preferred aspects is a more preferred aspect.

In addition, the weight-average molecular weight (Mw) and the number-average molecular weight (Mn) in the present disclosure are molecular weights in terms of polystyrene used as a standard substance, which are detected by using a solvent tetrahydrofuran (THF), a differential refractometer, and a gel permeation chromatography (GPC) analyzer using TSKgel GMHxL, TSKgel G4000HxL, and TSKgel G2000HxL (all trade names manufactured by Tosoh Corporation) as columns, unless otherwise specified.

In the present specification, the term "planographic printing plate precursor" includes not only a planographic printing plate precursor but also a key plate precursor. In addition, the term "planographic printing plate" includes not only a planographic printing plate produced by performing operations such as exposure and development, on a planographic printing plate precursor as necessary but also a key plate. In a case of the key plate precursor, operations of exposure and development are not necessarily required. In addition, a key plate is a planographic printing plate precursor for attachment to a plate cylinder which is not used, for example, in a case where printing is performed on a part of a paper surface with one or two colors in color newspaper printing.

Hereinafter, the present disclosure will be described in detail.

(Planographic Printing Plate Precursor)

The planographic printing plate precursor according to the embodiment of the present disclosure has an image recording layer on a support and an overcoat layer in this order, in which the overcoat layer includes particles, the overcoat layer is an outermost layer, and an occupation area ratio of the particles in a surface of the overcoat layer is 30% by area or more.

In addition, it is preferable that the planographic printing plate precursor according to the embodiment of the present disclosure is a planographic printing plate precursor for on-press development.

As a result of intensive research conducted by the present inventor, it has been found that a planographic printing plate precursor which has excellent impressing property and development scum-suppressing property can be provided by employing the above-described configuration.

The mechanism of the excellent effects obtained by employing the above-described configuration is not clear, but is assumed as follows.

As described above, the present inventor has found that at least one of impressing property or development scum-suppressing property in a planographic printing plate precursor of the related art is not sufficient, which is problematic.

As a result of intensive research conducted by the present inventor, by providing, as the outermost layer, the overcoat layer in which the occupation area ratio of the particles in the surface is 30% by area or more, it is possible to reduce the amount of dampening water which is permeated into the planographic printing plate precursor, particularly image recording layer, and to suppress the image recording layer in a non-image area from being detached in a case of applying dampening water so that development scum is generated. In addition, in a case where the occupation area ratio of the particles in the surface of the overcoat layer is 30% by area or more, since it is considered that the particles included in the overcoat layer, which is the outermost layer, and ink have high affinity, it is assumed that the ink can be held more and impressing property is improved.

<Overcoat Layer>

The planographic printing plate precursor according to the embodiment of the present disclosure has an image recording layer on a support and an overcoat layer in this order, and the overcoat layer is an outermost layer. The overcoat layer has a function of suppressing an image formation-impairing reaction caused by oxygen shielding and may additionally have a function of preventing the generation of scratches in the image recording layer and the ablation during exposure using high-illuminance lasers.

The overcoat layer includes at least particles. The particles may be inorganic particles or polymer particles. From the viewpoint of impressing property, development scum-suppressing property, and on-press developability, the particles are preferably polymer particles.

The overcoat layer may singly contain one kind of particle or may contain two or more kinds of particles.

From the viewpoint of development scum-suppressing property, the particles are preferably water-dispersible particles.

In addition, from the viewpoint of impressing property, the particles are preferably hydrophobic particles.

The inorganic particles are not particularly limited, and examples thereof include silica particles and alumina particles.

In addition, in a case where the particles included in the overcoat layer are inorganic particles, it is preferable that the surface of the particles is subjected to a hydrophobic treatment.

The polymer particles are not particularly limited. In a case where the particles included in the overcoat layer are polymer particles, from the viewpoint of impressing property and development scum-suppressing property, the polymer particles are preferably at least one kind of particle selected from the group consisting of acrylic resin particles, styrene acrylic resin particles, urethane resin particles, and melamine resin particles, and more preferably at least one kind of particle selected from the group consisting of acrylic resin particles and styrene acrylic resin particles.

In a case where the particles included in the overcoat layer are polymer particles, the weight-average molecular weight (Mw) of the polymer is not particularly limited. From the viewpoint of developability and on-press developability, the weight-average molecular weight (Mw) of the polymer is preferably in a range of 1,000 to 2,000,000, more preferably in a range of 3,000 to 1,000.000, and particularly preferably in a range of 5000 to 800,000. The weight-average molecular weight (Mw) of the polymer can be measured by the gel permeation chromatography method (GPC) in which polyethylene glycol is used as a standard substance.

In addition, in the present disclosure, the polymer refers to a compound having a weight-average molecular weight of 1,000 or greater.

The shape of the particles is not particularly limited, and examples thereof include a spherical shape, an ellipse shape, a plate shape, and a granular shape. Among these, from the viewpoint of impressing property, a spherical shape is preferable.

From the viewpoint of development scum-suppressing property, the volume average particle diameter of the particles is preferably less than 0.2 μm and more preferably less than 0.1 μm.

In a case where the particles included in the overcoat layer are polymer particles, the volume average particle diameter of the polymer particles is preferably in a range of 10 nm to 90 nm from the viewpoint of development scum-suppressing property.

In addition, in a case where the particles included in the overcoat layer are inorganic particles, from the viewpoint of development scum-suppressing property, the volume average particle diameter of the inorganic particles is preferably in a range of 1 nm to 90 nm, more preferably in a range of 1 nm to 40 nm, and still more preferably in a range of 2 nm to 30 nm. In the present disclosure, the volume average particle diameter of the particles is calculated by fractionating the particles and using a laser light scattering method.

From the viewpoint of impressing property, it is preferable that the volume average particle diameter of the particles included in the overcoat layer is smaller than the average film thickness of the overcoat layer. In addition, from the viewpoint of impressing property, it is preferable that at least a part of the surface of the particles is exposed to the overcoat layer.

In the planographic printing plate precursor according to the embodiment of the present disclosure, the occupation area ratio of the particles in the surface of the overcoat layer is 30% by area or more.

From the viewpoint of on-press developability, the occupation area ratio of the particles is preferably in a range of 30% by area to 100% by area, more preferably in a range of 40% by area to 80% by area, and still more preferably in a range of 50% by area to 75% by area.

The occupation area ratio of the particles in the surface of the overcoat layer in the present disclosure is measured using the following method.

After a carbon or Pt—Pd film is applied to a sample, if necessary, as a conductive treatment such that the thickness thereof is set to 3 nm, a reflection electron image is observed at an acceleration voltage of 5 kV to 10 kV using a SU8010 type field emission scanning electron microscope (FE-SEM) manufactured by Hitachi High-Technologies Corporation. The occupation area ratio of the particles is obtained by performing a binarization processing on an image captured by setting the observation magnification of 1,000 times and N=3 using a difference in contrast between the particles and the surrounding area thereof with image processing software (ImageJ or the like), and measuring the area of particles occupying 1 μm$^2$.

From the viewpoint of development scum-suppressing property, the ratio (volume average particle diameter of particles (unit: nm) occupation area ratio of particles (unit: % by area)) of the occupation area ratio of the particles (unit:% by area) to the volume average particle diameter of the particles (unit: nm) is preferably in a range of 0.5 to 5, more preferably in a range of 0.5 to 3, and still more preferably in a range of 0.5 to 1.5.

From the viewpoint of impressing property, the water contact angle at 25° C. of the overcoat layer is preferably 60° or greater, more preferably 70° or greater, and still more preferably in a range of 70° to 100°.

As a method for measuring water contact angle in the present disclosure, a contact angle (after 0.2 seconds) of a water droplet on the outermost layer at 25° C. is measured by DM-501 manufactured by Kyowa Interface Science Co., LTD.

In addition, from the viewpoint of development scum-suppressing property, it is preferable that the water contact angle is 60° or greater and the volume average particle diameter of the particles (unit: nm)/the occupation area ratio of the particles (unit:% by area) is in a range of 0.5 to 5, it is more preferable that the water contact angle is 70° or greater and the volume average particle diameter of the particles (unit: nm)/the occupation area ratio of the particles (unit: % by area) is in a range of 0.5 to 3, and it is still more preferable that the water contact angle is in a range of 70° to 100 and the volume average particle diameter of the particles (unit: nm)/the occupation area ratio of the particles (unit: % by area) is in a range of 0.5 to 1.5.

The overcoat layer preferably further includes a water-soluble polymer. The water-soluble polymer is not particularly limited, and a known water-soluble polymer can be used.

The water-soluble polymer may be contained alone or two or more kinds thereof.

The water-soluble polymer in the present disclosure is a polymer compound which dissolves as much as 1 g or more in 100 g of water at 25° C., preferably a polymer compound which dissolves as much as 5 g or more in 100 g of water at 25° C., and more preferably a polymer compound which dissolves as much as 10 g or more in 100 g of water at 25° C.

The water-soluble polymer preferably has at least one selected from the group consisting of a structure including a hydroxy group, a structure including a pyrrolidone ring, and a structure including an oxyalkylene group, which have an affinity particularly to water, as a repeating unit and more preferably has a structure including an oxyalkylene group as a structural repeating unit.

Specific examples of the water-soluble polymer including a hydroxy group include gum arabic, soya gum, carboxymethyl cellulose, hydroxymethyl cellulose, hydroxyethyl cellulose, polyhydroxyethylated cellulose, hydroxypropyl cellulose, hydroxypropyl methyl cellulose, glyoxalized hydroxypropyl methyl cellulose, hydroxypropyl methyl cellulose phthalate, methyl cellulose, and polyvinyl alcohol.

Specific examples of the water-soluble polymer including a pyrrolidone ring include polyvinyl pyrrolidone and a copolymer of vinyl pyrrolidone and vinyl acetate.

As specific examples of the water-soluble polymer including an oxyalkylene group, polyalkylene glycols such as polyethylene glycol and polyoxyethylene polyoxypropylene glycol (also referred to as polyoxyethylene-polyoxypropylene condensate), polyoxyalkylene monoalkyl or aryl ethers and polyoxyethylene polyoxypropylene alkyl ethers such as poly(ethylene glycol) methyl ether and polylethylene glycol) phenyl ether; polyglycerins or esters of polyglycerins such as polyglycerin, polyoxyethylene glycerin, and polyoxyethylene polyoxypropylene glyceryl ether, polyoxyethylene monoester, and polyoxyethylene alkyl ether ester are suitably used.

Among these, the water-soluble polymer preferably includes a polysaccharide, and from the viewpoint of developability and development scum-suppressing property, more preferably includes a cellulose compound.

The polysaccharide is not particularly limited as long as the polysaccharide is water-soluble, and examples of the polysaccharide include polysaccharides, polysaccharide derivatives, and alkali metal salts of these.

The cellulose compound in the present disclosure is a compound having water solubility, and preferably a compound in which a part of cellulose is modified.

As the cellulose compound, a compound in which at least a part of a hydroxyl group in cellulose is substituted with at least one selected from the group consisting of an alkyl group or a hydroxyalkyl group is preferably exemplified.

As the cellulose compound, alkyl cellulose compound or hydroxyalkyl cellulose compound is preferable, alkyl cellulose compound is more preferable, and methyl cellulose is particularly preferable.

As the hydroxyalkyl cellulose compound, hydroxypropyl cellulose or methyl cellulose is preferably exemplified.

) As the water-soluble polymer, from the viewpoint of developability and development scum-suppressing property, at least one water-soluble polymer selected from the group consisting of a cellulose compound, polyvinyl alcohol (PVA), polyvinyl pyrrolidone (PVP), and polyethylene glycol (PEG) is preferable, at least one water-soluble polymer selected from the group consisting of PVA, PVP, and methyl cellulose is more preferable, and methyl cellulose is particularly preferable.

The weight-average molecular weight (Mw) of the water-soluble polymer can be arbitrarily set by the performance design of the planographic printing plate precursor.

Here, from the viewpoint of developability and development scum-suppressing property, the weight-average molecular weight (Mw) of the water-soluble polymer is preferably in a range of 1,000 to 200,000, more preferably in a range of 3.000 to 100,000, and particularly preferably in a range of 5,000 to 70,000. The weight-average molecular weight (Mw) of the water-soluble polymer compound can be measured by the gel permeation chromatography method (GPC) in which polyethylene glycol is used as a standard substance.

In a case where the overcoat layer includes the water-soluble polymer, from the viewpoint of developability and development scum-suppressing property, the mass ratio (particles:water-soluble polymer) of the total content of the particles (hydrophobic particles) to the content of the water-soluble polymer is preferably 10:1 to 1:10, more preferably 5:1 to 1:1, and still more preferably 4:1 to 2:1.

The method for incorporating the particles into the overcoat layer is not particularly limited, and preferred examples thereof include the following method.

Examples thereof include a method in which the particles are applied to the surface of the overcoat layer in the produced planographic printing plate precursor so as to have a desired occupation area ratio.

Furthermore, examples thereof include a method in which an overcoat composition, which includes the particles or the particles and water-soluble polymer, is applied to a part of or the entire surface of the outermost layer in the produced planographic printing plate precursor.

From the viewpoint of impressing property and development scum-suppressing property, the total content of the particles is preferably 50% by mass or more, more preferably 80% by mass or more, and still more preferably 90% by mass or more with respect to the total mass of the overcoat composition.

From the viewpoint of impressing property and development scum-suppressing property, it is preferable that the surface of the overcoat layer has a longer distance from the support than the surface not including the particles.

The overcoat layer may contain, as the particles, an inorganic layered compound in order to enhance oxygen-shielding property, but it is preferable that the overcoat layer does not substantially contain the inorganic layered compound.

The phrase "does not substantially contain" means that the content of the inorganic layered compound is preferably 1% by mass or less, more preferably 0.5% by mass or less, and still more preferably 0.1% by mass or less with respect to the total mass of the particles included in the overcoat layer.

Specific examples of the inorganic layered compound include inorganic layered compounds included in the protective layer described later.

The overcoat layer may contain known additives such as a plasticizer for imparting flexibility, a surfactant for improving coating property, and the oil sensitizing agent in the image recording layer described later.

The overcoat layer is applied according to a known method. The coating amount (solid content) of the overcoat layer is preferably in a range of 0.01 g/m² to 10 g/m², more preferably in a range of 0.02 g/m² to 3 g/m², and particularly preferably in a range of 0.02 g/m² to 1 g/m².

From the viewpoint of impressing property and development scum-suppressing property, in the planographic printing plate precursor according to the embodiment of the present disclosure, the average film thickness of the overcoat layer is preferably in a range of 0.5 µm to 100 µm, more preferably in a range of 1 µm to 10 µm, and still more preferably in a range of 1 µm to 5 µm.

As a method for measuring the average film thickness of the overcoat layer, the thickness of the overcoat layer is measured at five or more places by cross-sectional observation and the average value thereof is calculated.

<Support>

The planographic printing plate precursor according to the embodiment of the present disclosure has a support.

As the support used in the planographic printing plate precursor according to the embodiment of the present disclosure, a known support is used.

In addition, as the support used in the planographic printing plate precursor according to the embodiment of the present disclosure, an aluminum support is preferable, and a hydrophilized aluminum support is more preferable.

Among these, an aluminum plate which has been subjected to an anodizing treatment is still more preferable and an aluminum plate which has been subjected to a roughening treatment and an anodizing treatment is particularly preferable.

The roughening treatment and the anodizing treatment can be performed according to known methods.

The aluminum plate can be subjected to a treatment appropriately selected from an expansion treatment or a sealing treatment of micropores of an anodized film described in JP2001-253181A and JP2001-322365A and a surface hydrophilization treatment using alkali metal silicate described in U.S. Pat. Nos. 2,714,066A, 3,181,461A, 3,280,734A, and 3,902,734A or polyvinyl phosphonic acid described in U.S. Pat. Nos. 3,276,868A, 4,153,461A, and 4,689,272A as necessary.

The center line average roughness Ra of the support is preferably in a range of 0.10 µm to 1.2 µm.

The rear surface of the support may be provided with an organic polymer compound described in JP1993-045885A (JP-H05-045885A) and a back coat layer including an alkoxy compound of silicon described in JP1994-035174A (JP-H06-035174A) as necessary.

<Image Recording Layer>

The planographic printing plate precursor according to the embodiment of the present disclosure has an image recording layer on the support.

The image recording layer in the present disclosure may be a positive type image recording layer or a negative type image recording layer, but a negative type image recording layer is preferable.

In addition, it is preferable that the image recording layer in the present disclosure is an image recording layer according to any of the following first to fifth aspects.

First aspect: the image recording layer contains an infrared absorbent, a polymerizable compound, and a polymerization initiator.

Second aspect: the image recording layer contains an infrared absorbent and thermoplastic polymer particles.

Third aspect: in the first aspect, the image recording layer further contains polymer particles or a microgel.

Fourth aspect: in the first aspect, the image recording layer further contains thermoplastic polymer particles.

Fifth aspect: in the fourth aspect, the image recording layer further contains a microgel.

According to the first aspect or the second aspect, it is possible to obtain a planographic printing plate precursor from which a planographic printing plate having excellent printing durability is obtained.

According to the third aspect, it is possible to obtain a planographic printing plate precursor having excellent on-press developability.

According to the fourth aspect, it is possible to obtain a planographic printing plate precursor having further excellent printing durability.

According to the fifth aspect, it is possible to obtain a planographic printing plate precursor having further excellent printing durability.

In addition, as the positive type image recording layer, a known image recording layer can be used.

In addition, according to a preferred aspect of the planographic printing plate precursor according to the embodiment of the present disclosure, the image recording layer is an image recording layer (hereinafter, also referred to as an "image recording layer A") containing an infrared absorbent, a polymerization initiator, a polymerizable compound, and a binder polymer.

According to another preferred aspect of the planographic printing plate precursor according to the embodiment of the present disclosure, the image recording layer is an image recording layer (hereinafter, also referred to as an "image recording layer B") containing an infrared absorbent, a polymerization initiator, a polymerizable compound, and a polymer compound having a particle shape.

According to a still another preferred aspect of the planographic printing plate precursor according to the embodiment of the present disclosure, the image recording layer is an image recording layer (hereinafter, also referred to as an "image recording layer C") containing an infrared absorbent and thermoplastic polymer particles.

-Image Recording Layer A-

The image recording layer A contains an infrared absorbent, a polymerization initiator, a polymerizable compound, and a binder polymer. Hereinafter, the constituent components of the image recording layer A will be described.

<<Infrared Absorbent>>

An infrared absorbent has a function of converting absorbed infrared rays into heat and a function of transferring electrons or energy or transferring both electrons and energy to a polymerization initiator described below through excitation by infrared rays. As the infrared absorbent used in the present disclosure, a dye or a pigment having maximum absorption at a wavelength of 760 nm to 1.200 nm is preferable and the dye is more preferable.

As the dye, dyes described in paragraphs 0082 to 0088 of JP2014-104631A can be used.

The average particle diameter of the pigment is preferably in a range of 0.01 µm to 1 µm and more preferably in a range of 0.01 µm to 0.5 µm. A known dispersion technique used to produce inks or toners can be used for dispersion of the pigment. The details are described in "Latest Pigment Application Technology" (CMC Publishing Co., Ltd., published in 1986) and the like.

The infrared absorbent may be used alone or in combination of two or more kinds thereof.

The content of the infrared absorbent is preferably in a range of 0.05% by mass to 30% by mass, more preferably in a range of 0.1% by mass to 20% by mass, and particularly preferably in a range of 0.2% by mass to 10% by mass with respect to the total mass of the image recording layer.

<<Polymerization Initiator>>

The polymerization initiator indicates a compound which initiates and promotes polymerization of a polymerizable compound. As the polymerization initiator, a known thermal polymerization initiator, a compound having a bond with small bond dissociation energy, a photopolymerization initiator, or the like can be used. Specifically, radical polymerization initiators described in paragraphs 0092 to 0106 of JP2014-104631A can be used.

Preferred examples of compounds of the polymerization initiators include onium salts. Among these, iodonium salts and sulfonium salts are particularly preferable. Preferred specific examples of the compounds in each of the salts are compounds described in paragraphs 0104 to 0106 of JP2014-104631 A.

The content of the polymerization initiator is preferably in a range of 0.1% by mass to 50% by mass, more preferably in a range of 0.5% by mass to 30% by mass, and particularly preferably in a range of 0.8% by mass to 20% by mass with respect to the total mass of the image recording layer. In a case where the content thereof is within the above-described range, improved sensitivity and improved stain resistance of a non-image area in a case of printing are obtained.

<<Polymerizable Compound>>

A polymerizable compound is an addition polymerizable compound having at least one ethylenically unsaturated bond, and is preferably selected from compounds having at least one, more preferably two or more, terminal ethylenically unsaturated bond. These have chemical forms such as a monomer, a pre-polymer, that is, a dimer, a trimer, and an oligomer, and a mixture of these. Specifically, polymerizable compounds described in paragraphs 0109 to 0113 of JP2014-104631A can be used.

Among the examples described above, from the viewpoint that the balance between hydrophilicity associated with on-press developability and polymerization ability associated with printing durability is excellent, isocyanuric acid ethylene oxide-modified acrylates such as tris(acryloyloxyethyl) isocyanurate and bis(acryloyloxyethyl)hydroxyethyl isocyanurate are particularly preferable.

The details of the structures of these polymerizable compounds, whether to be used alone or in combination, and the usage method such as the addition amount can be arbitrarily set according to the final performance design of a planographic printing plate precursor. The content of the above-described polymerizable compound to be used is preferably in a range of 5% by mass to 75% by mass, more preferably in a range of 10% by mass to 70% by mass, and particularly preferably in a range of 15% by mass to 60% by mass with respect to the total mass of the image recording layer.

<<Binder Polymer>>

A binder polymer can be mainly used to improve the film hardness of the image recording layer. As the binder polymer, known binder polymers of the related art can be used and polymers having coated-film properties are preferable. Among examples thereof, an acrylic resin, a polyvinyl acetal resin, a polyurethane resin, and the like are preferable.

Suitable examples of the binder polymer include polymers having a cross-linking functional group in the main chain or side chain, preferably in the side chain, for improving coated-film hardness of an image area as described in JP2008-195018A. Cross-linking occurs between polymer molecules by a cross-linking group so that curing is promoted.

Preferred examples of the cross-linking functional group include an ethylenically unsaturated group such as a (meth)acryl group, a vinyl group, an allyl group, or a styryl group (vinyl group bonded to a benzene ring) and an epoxy group, and the cross-linking functional group can be introduced into a polymer by a polymer reaction or copolymerization. For example, a reaction between an acrylic polymer having a carboxy group in the side chain thereof or polyurethane and glycidyl methacrylate or a reaction between a polymer having an epoxy group and ethylenically unsaturated group-containing carboxylic acid such as methacrylic acid can be used.

The content of the cross-linking group in the binder polymer is preferably in a range of 0.1 mmol to 10.0 mmol, more preferably in a range of 0.25 mmol to 7.0 mmol, and particularly preferably in a range of 0.5 mmol to 5.5 mmol per 1 g of the binder polymer.

In addition, it is preferable that the binder polymer has a hydrophilic group. The hydrophilic group contributes to imparting on-press developability to the image recording layer. In particular, in the coexistence of a cross-linking group and a hydrophilic group, both of printing durability and on-press developability can be achieved.

Examples of the hydrophilic group include a hydroxy group, a carboxy group, an alkylene oxide structure, an amino group, an ammonium group, an amide group, a sulfo group, and a phosphoric acid group. Among these, an alkylene oxide structure having 1 to 9 alkylene oxide units having 2 or 3 carbon atoms is preferable. A monomer having a hydrophilic group may be copolymerized in order to impart a hydrophilic group to the binder polymer.

In addition, in order to control impressing property, a lipophilic group such as an alkyl group, an aryl group, an aralkyl group, or an alkenyl group can be introduced into the binder polymer. For example, a lipophilic group-containing monomer such as methacrylic acid alkyl ester may be copolymerized.

The weight-average molecular weight (Mw) of the binder polymer is preferably 2,000 or greater, more preferably 5,000 or greater, and still more preferably in a range of 10,000 to 300,000.

The content of the binder polymer is preferably in a range of 3% by mass to 90% by mass, more preferably in a range of 5% by mass to 80% by mass, and still more preferably in a range of 10% by mass to 70% by mass with respect to the total mass of the image recording layer.

As a preferred example of the binder polymer, a polymer compound having a polyoxyalkylene chain in the side chain is exemplified. In a case where the image recording layer contains a polymer compound having a polyoxyalkylene chain in the side chain (hereinafter, also referred to as a "POA chain-containing polymer compound"), permeability of dampening water is promoted and on-press developability is improved.

Examples of the resin constituting the main chain of the POA chain-containing polymer compound include an acrylic resin, a polyvinyl acetal resin, a polyurethane resin, a polyurea resin, a polyimide resin, a polyamide resin, an epoxy resin, a methacrylic resin, a polystyrene-based resin, a novolac type phenolic resin, a polyester resin, synthetic rubber, and natural rubber. Among these, an acrylic resin is particularly preferable.

In the present disclosure, the "main chain" indicates relatively the longest bonding chain in a molecule of a polymer compound constituting a resin and the "side chain" indicates a branched chain branched from the main chain.

The POA chain-containing polymer compound does not substantially contain a perfluoroalkyl group. The expression "does not substantially contain a perfluoroalkyl group" means that the mass ratio of a fluorine atom present as a perfluoroalkyl group in a polymer compound is less than 0.5% by mass, and it is preferable that the polymer compound does not contain a fluorine atom. The mass ratio of the fluorine atom is measured by an elemental analysis method.

In addition, the "perfluoroalkyl group" is a group in which all hydrogen atoms of the alkyl group are substituted with fluorine atoms.

As alkylene oxide (oxyalkylene) in a polyoxyalkylene chain, an alkylene oxide having 2 to 6 carbon atoms is preferable, ethylene oxide (oxyethylene) or propylene oxide (oxypropylene) is more preferable, and ethylene oxide is still more preferable.

The repetition number of the alkylene oxide in a polyoxyalkylene chain, that is, a polyalkylene oxide moiety is preferably in a range of 2 to 50 and more preferably in a range of 4 to 25.

In a case where the repetition number of the alkylene oxide is 2 or greater, the permeability of dampening water is sufficiently improved. In addition, from the viewpoint that a degradation of printing durability is suppressed due to abrasion, it is preferable that the repetition number thereof is 50 or less.

As the polyalkylene oxide moiety, structures described in paragraphs 0060 to 0062 of JP2014-104631A are preferable.

The POA chain-containing polymer compound may have cross-linking properties in order to improve coated-film hardness of an image area. Examples of the POA chain-containing polymer compounds having cross-linking properties are described in paragraphs 0063 to 0072 of JP2014-104631A.

The proportion of repeating units having a polyalkylene oxide moiety in the total repeating units constituting the POA chain-containing polymer compound is not particularly limited, but is preferably in a range of 0.5 mol % to 80 mol % and more preferably in a range of 0.5 mol % to 30 mol %. Specific examples of the POA chain-containing polymer compounds are described in paragraphs 0075 and 0076 of JP2014-104631A.

As the POA chain-containing polymer compound, hydrophilic macromolecular compounds such as polyacrylic acid and polyvinyl alcohol described in JP2008-195018A can be used in combination as necessary. In addition, a lipophilic polymer compound and a hydrophilic polymer compound can be used in combination.

In addition to the presence of the POA chain-containing polymer compound in the image recording layer as a binder which plays a role of connecting image recording layer components with each other, the specific polymer compound may be present in the particle shape. In a case where the specific polymer compound is present in the particle shape, the average particle diameter is in a range of 10 nm to 1,000 nm, preferably in a range of 20 nm to 300 nm, and particularly preferably in a range of 30 nm to 120 nm.

The content of the POA chain-containing polymer compound is preferably in a range of 3% by mass to 90% by mass and more preferably in a range of 5% by mass to 80% by mass with respect to the total mass of the image recording layer. In a case where the content thereof is within the above-described range, both of permeability of dampening water and image formability can be reliably achieved.

Other preferred examples of the binder polymer include a polymer compound (hereinafter, also referred to as a "star polymer compound") which has a polymer chain bonded to a nucleus through a sulfide bond by means of using a polyfunctional, in a range of hexa- to deca-functional, thiol as the nucleus and in which the polymer chain has a polymerizable group. As the star polymer compound, for example, compounds described in JP2012-148555A can be preferably used.

Examples of the star polymer compound include compounds having a polymerizable group such as an ethylenically unsaturated bond in the main chain or in the side chain, preferably in the side chain, for improving coated-film hardness of an image area as described in JP2008-195018A. Cross-linking occurs between polymer molecules by a polymerizable group so that curing is promoted.

Preferred examples of the polymerizable group include an ethylenically unsaturated group such as a (meth)acryl group, a vinyl group, an allyl group, and a styryl group (vinyl group bonded to a benzene ring), and an epoxy group. Among these, from the viewpoint of polymerization reactivity, a (meth)acryl group, a vinyl group, or a styryl group (vinyl group bonded to a benzene ring) is more preferable and a (meth)acryl group is particularly preferable. The polymerizable group can be introduced into a polymer by a polymer reaction or copolymerization. For example, a reaction between a polymer having a carboxy group in the side chain thereof and glycidyl methacrylate or a reaction between a polymer having an epoxy group and ethylenically unsaturated group-containing carboxylic acid such as methacrylic acid can be used. These groups may be used in combination.

The content of the cross-linking group in the star polymer compound is preferably in a range of 0.1 mmol to 10.0 mmol, more preferably in a range of 0.25 mmol to 7.0 mmol, and particularly preferably in a range of 0.5 mmol to 5.5 mmol per 1 g of the star polymer compound.

In addition, it is preferable that the star polymer compound further includes a hydrophilic group. The hydrophilic group contributes to imparting on-press developability to the image recording layer. In particular, in the coexistence of a polymerizable group and a hydrophilic group, both of printing durability and on-press developability can be achieved.

Examples of the hydrophilic group include $-SO_3M^1$, $-OH$, $-CONR^1R^2$ ($M^1$ represents a hydrogen atom, a metal ion, an ammonium ion, or a phosphonium ion, $R^1$ and $R^2$ each independently represent a hydrogen atom, an alkyl group, an alkenyl group, or an aryl group, and $R^1$ and $R^2$ may be bonded to each other to form a ring), $-N'R^3R^4R^5X-$ ($R^3$ to $R^5$ each independently represent an alkyl group having 1 to 8 carbon atoms and X represents a counter anion), $-(CH_2CH_2O)_nR$, and $-(C_3H_6O)_mR$.

In the above-described formulae, n and m each independently represent an integer of 1 to 100 and R's each independently represent a hydrogen atom or an alkyl group having 1 to 18 carbon atoms.

Here, in a case where the star polymer compound is a star polymer compound having a polyoxyalkylene chain (for example, $-(CH_2CH_2O)_nR$ and $-(C_3H_6O)_nR$) in the side chain, such a star polymer compound is a polymer compound having the above-described polyoxyalkylene chain in the side chain.

Among these hydrophilic groups, $-CONR^1R^2$, $-(CH_2CH_2O)_nR$, or $-(C_3H_6O)_nR$ is preferable, $-CONR^1R^2$ or $-(CH_2CH_2O)_nR$ is more preferable, and $-(CH_2CH_2O)_nR$ is particularly preferable. Furthermore, in $-(CH_2CH_2O)_nR$, n represents preferably 1 to 10 and particularly preferably 1 to 4. In addition, R represents more preferably a hydrogen atom or an alkyl group having 1 to 4 carbon atoms and particularly preferably a hydrogen atom or a methyl group. These hydrophilic groups may be used in combination of two or more kinds thereof.

In addition, it is preferable that the star polymer compound does not substantially include a carboxylic acid group, a phosphoric acid group, or a phosphonic acid group. Specifically, the amount of these acid groups is preferably less than 0.1 mmol/g, more preferably less than 0.05 mmol/g, and particularly preferably 0.03 mmol/g or less. In a case where the amount of these acid groups is less than 0.1 mmol/g, on-press developability is further improved.

In order to control impressing property, a lipophilic group such as an alkyl group, an aryl group, an aralkyl group, or an alkenyl group can be introduced into the star polymer compound. Specifically, a lipophilic group-containing monomer such as methacrylic acid alkyl ester may be copolymerized.

Specific examples of the star polymer compound include compounds described in paragraphs 0153 to 0157 of JP2014-104631A.

The star polymer compound can be synthesized, using a known method, by performing radical polymerization on the above-described monomers constituting a polymer chain in the presence of the above-described polyfunctional thiol compound.

The weight-average molecular weight of the star polymer compound is preferably in a range of 5,000 to 500,000, more preferably in a range of 10,000 to 250,000, and particularly preferably in a range of 20,000 to 150,000. In a case where the weight-average molecular weight thereof is in the above-described range, the on-press developability and the printing durability are more improved.

The star polymer compound may be used alone or in combination of two or more kinds thereof. In addition, the star polymer compound may be used in combination with a typical linear binder polymer.

The content of the star polymer compound is preferably in a range of 5% by mass to 95% by mass, more preferably in a range of 10% by mass to 90% by mass, and particularly preferably in a range of 15 to 85% by mass with respect to the total mass of the image recording layer.

From the viewpoint of promoting the permeability of dampening water and improving the on-press developability, star polymer compounds described in JP2012-148555A are particularly preferable.

Other Components

The image recording layer A can contain other components described below as necessary.
(1) Low-Molecular Weight Hydrophilic Compound In order to improve the on-press developability without degrading the printing durability, the image recording layer may contain a low-molecular weight hydrophilic compound.

As the low-molecular weight hydrophilic compound, examples of a water-soluble organic compound include glycols such as ethylene glycol, diethylene glycol, triethylene glycol, propylene glycol, dipropylene glycol, and tripropylene glycol and ether or ester derivatives thereof; polyols such as glycerin, pentaerythritol, and tris(2-hydroxyethyl) isocyanurate; organic amines such as triethanolamine, diethanolamine, and monoethanolamine and salts thereof; organic sulfonic acids such as alkylsulfonic acid, toluenesulfonic acid, and benzenesulfonic acid and salts thereof; organic sulfamic acids such as alkyl sulfamic acid and salts thereof; organic sulfuric acids such as alkyl sulfuric acid and alkyl ether sulfuric acid and salts thereof; organic phosphonic acids such as phenyl phosphonic acid and salts thereof; organic carboxylic acids such as tartaric acid, oxalic acid, citric acid, malic acid, lactic acid, gluconic acid, and amino acids and salts thereof; and betaines.

Among these, it is preferable that the image recording layer contains at least one compound selected from the group consisting of polyols, organic sulfates, organic sulfonates, and betaines.

Specific examples of the compounds of the organic sulfonates include compounds described in paragraphs 0026 to 0031 of JP2007-276454A and paragraphs 0020 to 0047 of JP2009-154525A. The salt may be potassium salts or lithium salts.

Examples of the organic sulfates include compounds described in paragraphs 0034 to 0038 of JP2007-276454A.

As betaines, compounds having 1 to 5 carbon atoms of hydrocarbon substituents to nitrogen atoms are preferable. Specific examples thereof include trimethyl ammonium acetate, dimethyl propyl ammonium acetate, 3-hydroxy-4-trimethyl ammonio butyrate, 4-(1-pyridinio)butyrate, 1-hydroxyethyl-1-imidazoleacetate, trimethyl ammonium methane sulfonate, dimethyl propyl ammonium methane sulfonate, 3-trimethylammonio-1-propane sulfonate, and 3-(1-pyridinio)-1-propane sulfonate.

Since the low-molecular weight hydrophilic compound has a small structure of a hydrophobic portion, hydrophobicity and coated-film hardness of an image area is not degraded by dampening water permeating into an image recording layer exposed area (image area) and ink receptivity and printing durability of the image recording layer can be maintained satisfactorily.

The addition amount of the low-molecular weight hydrophilic compound is preferably in a range of 0.5% by mass to 20% by mass, more preferably in a range of 1% by mass to 15% by mass, and still more preferably in a range of 2% by mass to 10% by mass with respect to the total mass of the image recording layer. Ina case where the amount thereof is within the above-described range, excellent on-press developability and printing durability can be obtained.

The low-molecular weight hydrophilic compound may be used alone or in combination of two or more kinds thereof.
(2) Oil Sensitizing Agent In order to improve the impressing property, an oil sensitizing agent such as a phosphonium compound, a nitrogen-containing low-molecular weight compound, or an ammonium group-containing polymer can be used for the image recording layer. In particular, in a case where the overcoat layer or a protective layer contains an inorganic layered compound, the above-described compounds function as a surface coating agent of the inorganic layered compound and prevent a degradation in impressing property due to the inorganic layered compound during the printing.

The phosphonium compound, the nitrogen-containing low-molecular weight compound, and the ammonium group-containing polymer are described in paragraphs 0184 to 0190 of JP2014-104631A in detail.

The content of the oil sensitizing agent is preferably in a range of 0.01% by mass to 30.0% by mass, more preferably in a range of 0.1% by mass to 15.0% by mass, and still more preferably in a range of 1% by mass to 10% by mass with respect to the total mass of the image recording layer.
(3) Other Components The image recording layer may further contain other components such as a surfactant, a coloring agent, a printing-out agent, a polymerization inhibitor, a higher fatty acid derivative, a plasticizer, inorganic particles, an inorganic layered compound, a co-sensitizer, and a chain transfer agent. Specifically, the compounds and the addition amounts described in paragraphs 0114 to 0159 of JP2008-284817A, paragraphs 0023 to 0027 of JP2006-091479A, and paragraph 0060 of US2008/0311520A can be preferably used.

<<Formation of Image Recording Layer A>>

The image recording layer A is formed by dispersing or dissolving each of the above-described required components in a known solvent to prepare a coating solution, coating a support with the coating solution directly or through an undercoat layer using a known method such as a bar coater coating method, and drying the resultant, as described in paragraphs 0142 and 0143 of JP2008-195018A. The coating amount of the image recording layer (solid content) on the support to be obtained after the coating and the drying varies depending on the applications thereof, but is preferably in a range of 0.3 g/m$^2$ to 3.0 g/m$^2$. In a case where the coating amount thereof is within the above-described range, excellent sensitivity and excellent film-coating characteristics of the image recording layer are obtained.

-Image Recording Layer B-

The image recording layer B contains an infrared absorbent, a polymerization initiator, a polymerizable compound, and a polymer compound having a particle shape. Hereinafter, the constituent components of the image recording layer B will be described.

Similarly, the infrared absorbent, the polymerization initiator, and the polymerizable compound described in the image recording layer A can be used as an infrared absorbent, a polymerization initiator, and a polymerizable compound in the image recording layer B.

<<Polymer Compound Having Particle Shape>>

It is preferable that the polymer compound having a particle shape is selected from the group consisting of thermoplastic polymer particles, thermally reactive polymer particles, polymer particles having a polymerizable group, a microcapsule encapsulating a hydrophobic compound, and a microgel (cross-linked polymer particles). Among these, polymer particles having a polymerizable group and a microgel are preferable. According to a particularly preferred embodiment, the polymer compound having a particle shape includes at least one ethylenically unsaturated polymerizable group. Because of the presence of the polymer compound having a particle shape, effects of improving the printing durability of an exposed area and the on-press developability of an unexposed area are obtained.

In addition, it is preferable that the polymer compound having a particle shape is thermoplastic polymer particles.

Preferred examples of the thermoplastic polymer particles include thermoplastic polymer particles described in Research Disclosure No. 33303 on January, 1992, JP1997-123387A (JP-H09-123387A), JP1997-131850A (JP-H09-131850A), JP1997-171249A (JP-H09-171249A), JP1997-171250A (JP-H09-171250A), and EP931647B.

Specific examples of a polymer constituting the thermoplastic polymer particles include homopolymers or copolymers of monomers such as acrylate or methacrylate having structures of ethylene, styrene, vinyl chloride, methyl acrylate, ethyl acrylate, methyl methacrylate, ethyl methacrylate, vinylidene chloride, acrylonitrile, vinyl carbazole, and polyalkylene, and mixtures of these. Among these, polystyrene, styrene, a copolymer containing acrylonitrile, or polymethylmethacrylate is more preferable. The average particle diameter of the thermoplastic polymer particles is preferably in a range of 0.01 µm to 3.0 µm.

Examples of the thermally reactive polymer particles include polymer particles having a thermally reactive group. The thermally reactive polymer particles are cross-linked by a thermal reaction and have hydrophobic regions formed by a change in functional groups during the cross-linking.

As the thermally reactive group in polymer particles having a thermally reactive group, a functional group that performs any reaction may be used as long as a chemical bond is formed, but a polymerizable group is preferable. Preferred examples of the polymerizable group include an ethylenically unsaturated group that performs a radical polymerization reaction (such as an acryloyl group, a methacryloyl group, a vinyl group, or an allyl group); a cationic polymerizable group (such as a vinyl group, a vinyloxy group, an epoxy group, or an oxetanyl group); an isocyanate group that performs an addition reaction or a block body thereof, an epoxy group, a vinyloxy group, and a functional group having an active hydrogen atom as a reaction partner of these (such as an amino group, a hydroxy group, or a carboxy group); a carboxy group that performs a condensation reaction and a hydroxy group or an amino group as a reaction partner thereof; and an acid anhydride that performs a ring-opening addition reaction and an amino group or a hydroxy group as a reaction partner thereof.

The microcapsule is a microcapsule in which at least a part of constituent components of the image recording layer is encapsulated as described in JP200)-277740A and JP2001-277742A. The constituent components of the image recording layer may be contained in a portion other than the microcapsule. A preferred aspect of the image recording layer containing the microcapsule is an aspect in which hydrophobic constituent components are encapsulated in a microcapsule and hydrophilic constituent components are contained in a portion other than the microcapsule.

The microgel (cross-linked polymer particles) may contain a part of the constituent components of the image recording layer in at least one of the surface or the inside of the microgel. From the viewpoints of image forming sensitivity and printing durability, a reactive microgel having a radical polymerizable group on the surface thereof is particularly preferable.

The constituent components of the image recording layer can be made into microcapsules or microgels using a known method.

From the viewpoints of the printing durability, stain resistance, and storage stability, it is preferable that the polymer compound having a particle shape is obtained by reacting a polyvalent isocyanate compound which is an adduct of a polyhydric phenol compound containing two or more hydroxy groups in a molecule and isophorone diisocyanate with a compound containing an active hydrogen.

As the polyhydric phenol compound, a compound having a plurality of benzene rings containing a phenolic hydroxy group is preferable.

As the compound having an active hydrogen, a polyol compound or a polyamine compound is preferable, a polyol compound is more preferable, and at least one compound selected from the group consisting of propylene glycol, glycerin, and trimethylolpropane is still more preferable.

As the resin particles obtained by reacting the compound containing an active hydrogen with the polyvalent isocyanate compound which is an adduct of a polyhydric phenol compound containing two or more hydroxy groups in a molecule and isophorone diisocyanate, polymer particles described in paragraphs 0032 to 0095 of JP2012-206495A are preferably exemplified.

Furthermore, from the viewpoints of the printing durability and the solvent resistance, it is preferable that the polymer compound having a particle shape has a hydrophobic main chain and both of a constitutional unit (i) which contains a pendant-cyano group directly bonded to the hydrophobic main chain and a constitutional unit (ii) which contains a pendant group having a hydrophilic polyalkylene oxide segment.

Preferred examples of the hydrophobic main chain include an acrylic resin chain.

Preferred examples of the pendant-cyano group include —[CH$_2$CH(C≡N)—] and —[CH$_2$C(CH)(C≡N)—].

In addition, a constitutional unit having the pendant-cyano group can be easily derived from an ethylene-based unsaturated monomer such as acrylonitrile or methacrylonitrile or a combination of these.

In addition, as the alkylene oxide in the hydrophilic polyalkylene oxide segment, ethylene oxide or propylene oxide is preferable and ethylene oxide is more preferable.

The repetition number of alkylene oxide structures in the hydrophilic polyalkylene oxide segment is preferably in a range of 10 to 100, more preferably in a range of 25 to 75, and still more preferably in a range of 40 to 50.

As the resin particles which have a hydrophobic main chain and both of a constitutional unit (i) containing a pendant-cyano group directly bonded to the hydrophobic main chain and a constitutional unit (ii) containing a pendant group having a hydrophilic polyalkylene oxide segment, those described in paragraphs 0039 to 0068 of JP2008-503365A are preferably exemplified.

The average particle diameter of the polymer compound having a particle shape is preferably in a range of 0.01 μm to 3.0 μm, more preferably in a range of 0.03 μm to 2.0 μm, and still more preferably in a range of 0.10 μm to 1.0 μm. In a case where the average particle diameter thereof is within the above-described range, excellent resolution and temporal stability are obtained.

The content of the polymer compound having a particle shape is preferably in a range of 5% by mass to 90% by mass with respect to the total mass of the image recording layer.

Other Components

The image recording layer B can contain the other components described in the above-described image recording layer A as necessary.

<Formation of image recording layer B>

The image recording layer B can be formed in the same manner as the image recording layer A described above.

-Image Recording Layer C-

The image recording layer C contains an infrared absorbent and thermoplastic polymer particles. Hereinafter, the constituent components of the image recording layer C will be described.

<<Infrared Absorbent>>

The infrared absorbent contained in the image recording layer C is a dye or a pigment having maximum absorption at a wavelength in a range of 760 nm to 1,200 nm. A dye is more preferable.

As the dye, commercially available dyes and known dyes described in the literatures (for example, "Dye Handbook" edited by The Society of Synthetic Organic Chemistry, Japan, published in 1970, "Near-Infrared Absorbing Coloring agent" of "Chemical Industry", pages. 45 to 51, published in May, 1986, and "Development and Market Trend of Functional Dyes in 1990's" Section 2.3 of Chapter 2 (CMC Publishing Co., Ltd., published in 1990)) and the patents can be used. Preferred specific examples thereof include infrared absorbing dyes such as an azo dye, a metal complex salt azo dye, a pyrazolone azo dye, an anthraquinone dye, a phthalocyanine dye, a carbonium dye, a quinone imine dye, a polymethine dye, and a cyanine dye.

Among these, infrared absorbing dyes having a water-soluble group are particularly preferable to be added to the image recording layer C.

Specific examples of the infrared absorbing dyes are described below, but the present disclosure is not limited thereto.

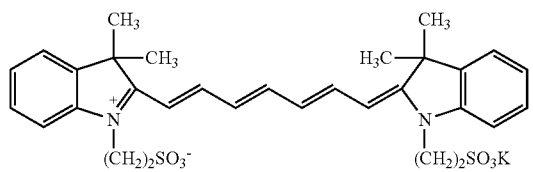

(IR-1)

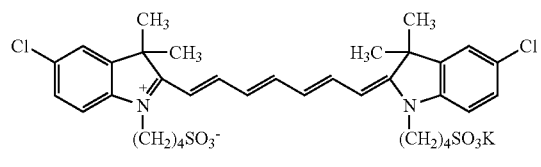

(IR-2)

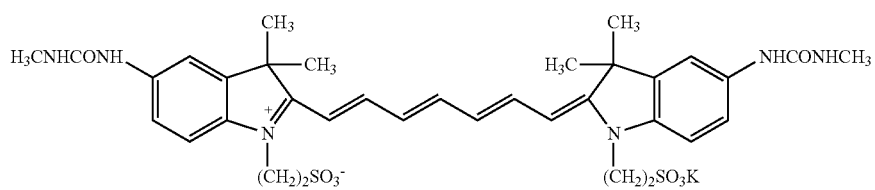

(IR-3)

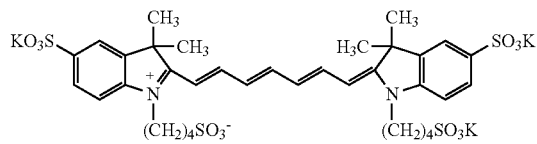

(IR-4)

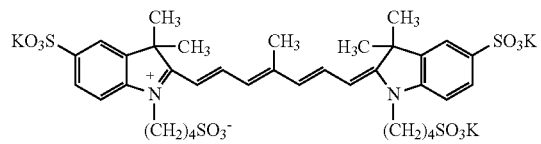

(IR-5)

-continued

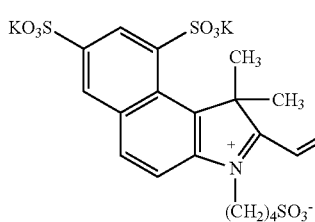
(IR-6)

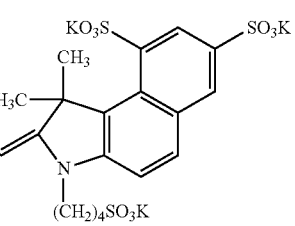

(IR-7)

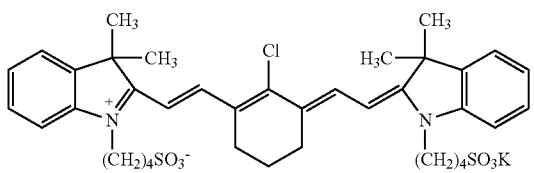

(IR-8)

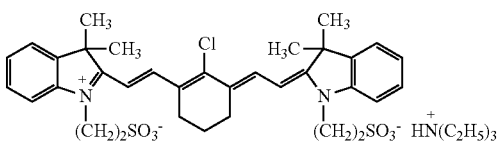

(IR-9)

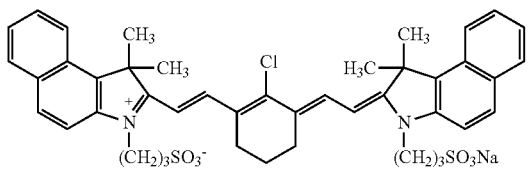

(IR-10)

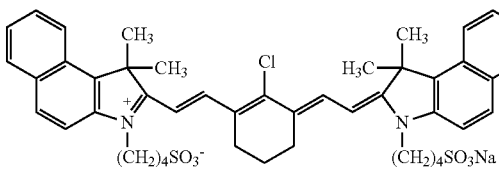

(IR-11)

As the pigments, commercially available pigments and pigments described in Color Index (C. I) Handbook, "Latest Pigment Handbook" (edited by Japan Pigment Technology Association, published in 1977), "Latest Pigment Application Technology" (CMC Publishing Co., Ltd., published in 1986), and "Printing Ink Technology" (CMC Publishing Co., Ltd., published in 1984) can be used.

The particle diameter of the pigment is preferably in a range of 0.01 μm to 1 μm and more preferably in a range of 0.01 μm to 0.5 μm. A known dispersion technique used to produce inks or toners can be used as a method of dispersing the pigment. The details are described in "Latest Pigment Application Technology" (CMC Publishing Co., Ltd., published in 1986).

The content of the infrared absorbent is preferably in a range of 0.1% by mass to 30% by mass, more preferably in a range of 0.25% by mass to 25% by mass, and particularly preferably in a range of 0.5% by mass to 20% by mass with respect to the total mass of the image recording layer. In a case where the content thereof is within the above-described range, excellent sensitivity is obtained without damaging the film hardness of the image recording layer.

<<Thermoplastic Polymer Particles>>

The glass transition temperature (Tg) of the thermoplastic polymer particles is preferably in a range of 60° C. to 250° C. Tg of the thermoplastic polymer particles is more preferably in a range of 70° C. to 140° C. and still more preferably in a range of 80° C. to 120° C.

Suitable examples of the thermoplastic polymer particles having a Tg of 60° C. or higher include thermoplastic polymer particles described in Research Disclosure No. 33303 on January, 1992, JP1997-123387A (JP-H09-123387A), JP1997-131850A (JP-H09-131850A), JP1997-171249A (JP-H09-171249A), JP1997-171250A (JP-H09-171250A), and EP931647B.

Specific examples thereof include homopolymers or copolymers formed of monomers such as ethylene, styrene, vinyl chloride, methyl acrylate, ethyl acrylate, methyl methacrylate, ethyl methacrylate, vinylidene chloride, acrylonitrile, and vinyl carbazole, and mixtures of these. Among these, polystyrene, a copolymer containing styrene and acrylonitrile, and polymethyl methacrylate are preferable.

The average particle diameter of the thermoplastic polymer particles is preferably in a range of 0.005 μm to 2.0 μm from the viewpoints of resolution and temporal stability. This value is used as the average particle diameter in a case where two or more kinds of thermoplastic polymer particles are mixed with each other. The average particle diameter thereof is more preferably in a range of 0.01 μm to 1.5 μm and particularly preferably in a range of 0.05 μm to 1.0 μm. The polydispersity in a case where two or more kinds of thermoplastic polymer particles are mixed with each other is preferably 0.2 or greater.

In the present disclosure, the average particle diameter and the polydispersity are calculated according to a laser light scattering method.

The thermoplastic polymer particles may be used in combination of two or more kinds thereof. Specifically, at least two kinds of thermoplastic polymer particles with different particle sizes or at least two kinds of thermoplastic polymer particles with different Tg's may be exemplified. In a case where two or more kinds of thermoplastic polymer particles are used in combination, coated-film curing properties of an image area are further improved and printing durability in a case where a planographic printing plate is obtained is further improved.

For example, in a case where thermoplastic polymer particles having the same particle size are used, voids are present between the thermoplastic polymer particles to some extent and thus the curing properties of the coated-film are not desirable in some cases even in a case where the thermoplastic polymer particles are melted and solidified by image exposure. Meanwhile, in a case where thermoplastic polymer particles having different particle sizes are used, the void volume between the thermoplastic polymer particles can be decreased and thus the coated-film curing properties of the image area after image exposure can be improved.

In addition, in a case where thermoplastic polymer particles having the same Tg are used, the thermoplastic polymer particles are not sufficiently melted and solidified in some cases where an increase in temperature of the image recording layer resulting from image exposure is insufficient, and thus the curing properties of the coated-film are not desirable. Meanwhile, in a case where thermoplastic polymer particles having different Tg's are used, the coated-film curing properties of the image area can be improved even in a case where an increase in temperature of the image recording layer resulting from image exposure is insufficient.

In a case where two or more kinds of thermoplastic polymer particles having different Tg's are used in combination, the Tg of at least one thermoplastic polymer particle is preferably 60° C. or higher. At this time, a difference in Tg's is preferably 10° C. or higher and more preferably 20° C. or higher. In addition, the content of the thermoplastic polymer particles having a Tg of 60° C. or higher is preferably 70% by mass or greater with respect to the total amount of all thermoplastic polymer particles, The thermoplastic polymer particles may include a cross-linking group. In a case where thermoplastic polymer particles having a cross-linking group are used, the cross-linking group is thermally reacted due to heat generated by an image-exposed area so as to be cross-linked between the polymers, and thus coated-film hardness of the image area is improved and printing durability is more excellent. As the cross-linking group, a functional group that performs any reaction may be used as long as a chemical bond is formed, and examples thereof include an ethylenically unsaturated group that performs a polymerization reaction (such as an acryloyl group, a methacryloyl group, a vinyl group, or an allyl group); an isocyanate group that performs an addition reaction or a block body thereof, and a group having an active hydrogen atom as a reaction partner of these (such as an amino group, a hydroxy group, or a carboxyl group); an epoxy group that performs an addition reaction and an amino group, a carboxyl group or a hydroxy group as a reaction partner thereof; a carboxyl group that performs a condensation reaction and a hydroxy group or an amino group; and an acid anhydride that performs a ring-opening addition reaction and an amino group or a hydroxy group.

Specific examples of the thermoplastic polymer particles having a cross-linking group include thermoplastic polymer particles having a cross-linking group such as an acryloyl group, a methacryloyl group, a vinyl group, an allyl group, an epoxy group, an amino group, a hydroxy group, a carboxyl group, an isocyanate group, an acid anhydride, and a protecting group of these. These cross-linking groups may be introduced into polymers in a case of polymerization of polymer particles or may be introduced using a polymer reaction after polymerization of the polymer particles.

In a case where a cross-linking group is introduced to a polymer in a case of polymerization of polymer particles, it is preferable that a monomer having a cross-linking group may be subjected to an emulsion polymerization or a suspension polymerization. Specific examples of the monomer having a cross-linking group include allyl methacrylate, allyl acrylate, vinyl methacrylate, vinyl acrylate, glycidyl methacrylate, glycidyl acrylate, 2-isocyanate ethyl methacrylate or a block isocyanate resulting from alcohol thereof, 2-isocyanate ethyl acrylate or a block isocyanate resulting from alcohol thereof, 2-aminoethyl methacrylate, 2-aminoethyl acrylate, 2-hydroxyethyl methacrylate, 2-hydroxyethyl acrylate, acrylic acid, methacrylic acid, maleic acid anhydride, bifunctional acrylate, and bifunctional methacrylate. Examples of the polymer reaction used in a case where a cross-linking group is introduced after polymerization of polymer particles include polymer reactions described in WO96/034316A.

Polymer particles may react with each other through a cross-linking group or the thermoplastic polymer particles may react with a polymer compound or a low-molecular weight compound added to the image recording layer.

The content of the thermoplastic polymer particles is preferably in a range of 50% by mass to 95% by mass, more preferably in a range of 60% by mass to 90% by mass, and particularly preferably in a range of 70% by mass to 85% by mass with respect to the total mass of the image recording layer.

Other Components

The image recording layer C may further contain other components as necessary.

Preferred examples of other components include a surfactant having a polyoxyalkylene group or a hydroxy group.

As the surfactant having a polyoxyalkylene group (hereinafter, also referred to as a "POA group") or a hydroxy group, a surfactant having a POA group or a hydroxy group may be suitably used, but an anionic surfactant or a non-ionic surfactant is preferable. Among anionic surfactants or non-ionic surfactants having a POA group or a hydroxy group, anionic surfactants or non-ionic surfactants having a POA group are preferable.

As the POA group, a polyoxyethylene group, a polyoxypropylene group, or a polyoxybutylene group is preferable and a polyoxyethylene group is particularly preferable.

The average degree of polymerization of the oxyalkylene group is preferably 2 to 50 and more preferably 2 to 20.

The number of the hydroxy group is preferably 1 to 10 and more preferably 2 to 8. Here, the number of terminal hydroxy groups in the oxyalkylene group is not included in the number of hydroxy groups.

The anionic surfactant having a POA group is not particularly limited, and examples thereof include polyoxyalkylene alkyl ether carboxylates, polyoxyalkylene alkyl sulfosuccinates, polyoxyalkylene alkyl ether sulfuric acid ester salts, alkyl phenoxy polyoxyalkylene propyl sulfonates, polyoxyalkylene alkyl sulfophenyl ethers, polyoxyalkylene aryl ether sulfuric acid ester salts, polyoxyalkylene polycyclic phenylether sulfuric acid ester salts, polyoxyalkylene styryl phenyl ether sulfuric acid ester salts, polyoxyalkylene alkyl ether phosphoric acid ester salts, polyoxyalkylene alkyl phenyl ether phosphoric acid ester salts, and polyoxyalkylene perfluoroalkyl ether phosphoric acid ester salts.

The anionic surfactant having a hydroxy group is not particularly limited, and examples thereof include hydroxy carboxylates, hydroxy alkyl ether carboxylates, hydroxy alkane sulfonates, fatty acid monoglyceride sulfuric acid ester salts, and fatty acid monoglyceride acid ester salts.

The content of the surfactant having a POA group or a hydroxy group is preferably in a range of 0.05% by mass to 15% by mass and more preferably in a range of 0.1% by mass to 10% by mass with respect to the total mass of the image recording layer.

Hereinafter, specific examples of the surfactant having a POA group or a hydroxy group will be described, but the present disclosure is not limited thereto. A surfactant A-12 described below is a trade name of Zonyl FSP and available from Dupont. In addition, a surfactant N-11 described below is a trade name of Zonyl FSO 100 and available from Dupont. m and n in N-11 and A-12 each independently represent an integer of 1 or greater.

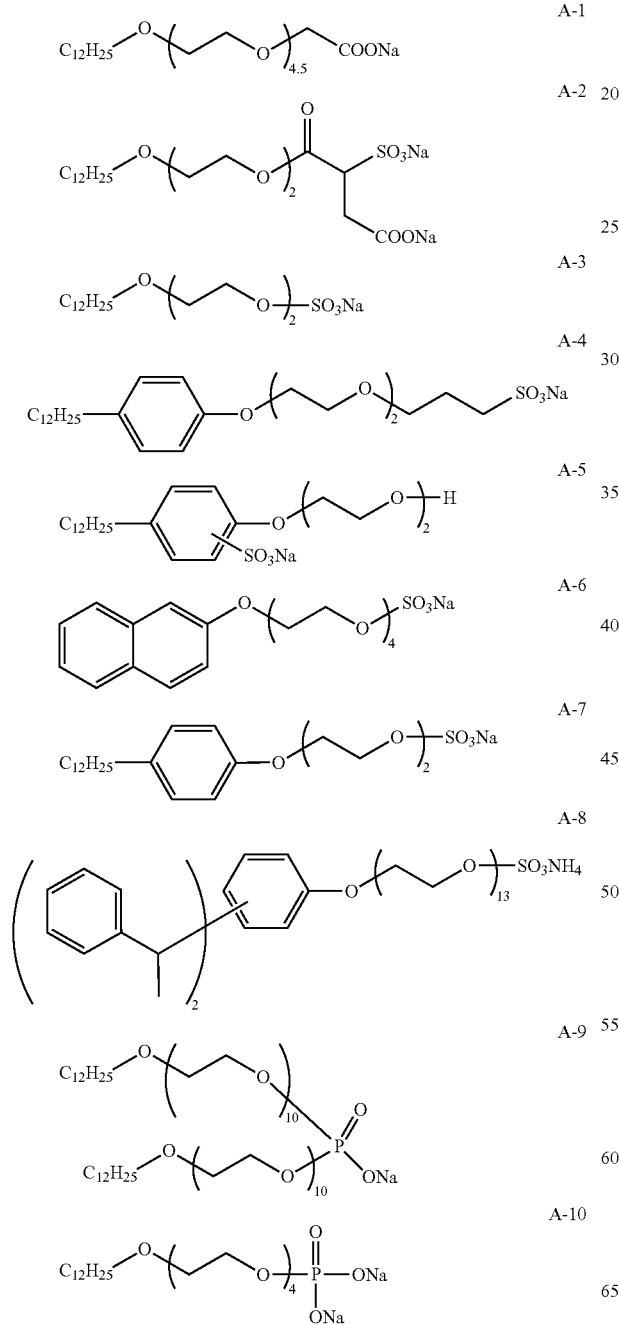
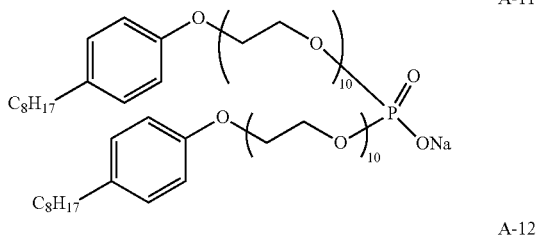
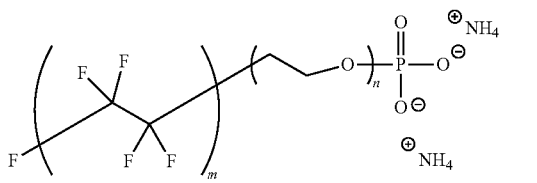
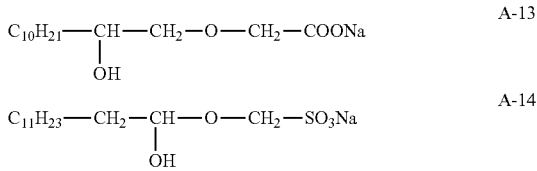
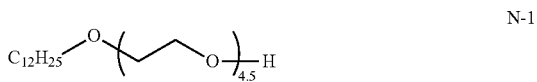
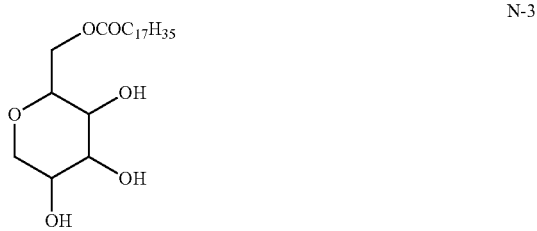
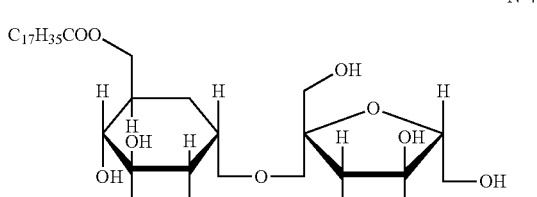
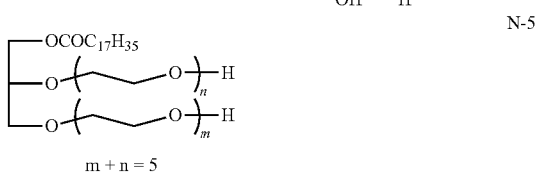

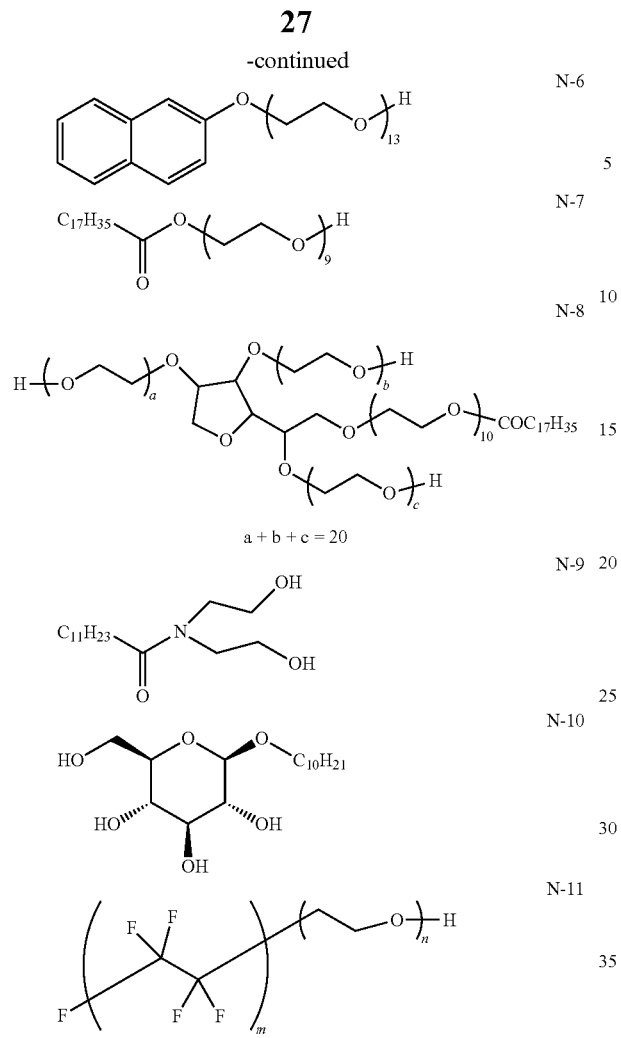

For the purpose of ensuring coating uniformity of the image recording layer, the image recording layer may contain an anionic surfactant that does not have a polyoxyalkylene group or a hydroxy group.

The anionic surfactant is not particularly limited as long as the above-described purpose is achieved. Among the examples of the anionic surfactants, alkyl benzene sulfonic acid or a salt thereof, alkyl naphthalene sulfonic acid or a salt thereof, (di)alkyl diphenyl ether (di)sulfonic acid or a salt thereof, or alkyl sulfuric acid ester salt is preferable.

The addition amount of the anionic surfactant that does not have a polyoxyalkylene group or a hydroxy group is preferably in a range of 1% by mass to 50% by mass and more preferably in a range of 1% by mass to 30% by mass with respect to the total mass of the surfactant which has a polyoxyalkylene group or a hydroxy group.

Hereinafter, specific examples of the anionic surfactant that does not have a polyoxyalkylene group or a hydroxy group will be described, but the present disclosure is not limited thereto.

In addition, for the purpose of ensuring coating uniformity of the image recording layer, a non-ionic surfactant that does not have a polyoxyalkylene group or a hydroxy group or a fluorine-based surfactant may be used. For example, fluorine-based surfactants described in JP1987-170950A (JP-S62-170950A) are preferably used.

The image recording layer may contain a hydrophilic resin. Preferred examples of the hydrophilic resin include resins having a hydrophilic group such as a hydroxy group, a hydroxyethyl group, a hydroxypropyl group, an amino group, an aminoethyl group, an aminopropyl group, a carboxy group, a carboxylate group, a sulfo group, a sulfonate group, and a phosphoric acid group.

Specific examples of the hydrophilic resin include gum arabic, casein, gelatin, a starch derivative, carboxy methyl cellulose and sodium salt thereof, cellulose acetate, sodium alginate, vinyl acetate-maleic acid copolymers, styrene-maleic acid copolymers, polyacrylic acids and salts of these, polymethacrylic acids and salts of these, a homopolymer and a copolymer of hydroxyethyl methacrylate, a homopolymer and a copolymer of hydroxyethyl acrylate, a homopolymer and a copolymer of hydroxypropyl methacrylate, a homopolymer and a copolymer of hydroxypropyl acrylate, a homopolymer and a copolymer of hydroxybutyl methacrylate, a homopolymer and a copolymer of hydroxybutyl acrylate, polyethylene glycols, hydroxypropylene polymers, polyvinyl alcohols, hydrolyzed polyvinyl acetate having a degree of hydrolysis of preferably at least 60% and more preferably at least 80%, polyvinyl formal, polyvinyl butyral, polyvinyl pyrrolidone, a homopolymer and a copolymer of acrylamide, a homopolymer and a copolymer of methacrylamide, and a homopolymer and a copolymer of N-methylol acrylamide.

The weight-average molecular weight of the hydrophilic resin is preferably 2,000 or greater from the viewpoint of obtaining sufficient coated-film hardness and printing durability.

The content of the hydrophilic resin is preferably in a range of 0.5% by mass to 50% by mass and more preferably in a range of 1% by mass to 30% by mass with respect to the total mass of the image recording layer.

The image recording layer may contain inorganic particles. Suitable examples of the inorganic particles include silica, alumina, magnesium oxide, titanium oxide, magnesium carbonate, calcium alginate, and a mixture of these. The inorganic particles can be used for the purpose of improving coated-film hardness.

The average particle diameter of the inorganic particles is preferably in a range of 5 nm to 10 µm and more preferably in a range of 10 nm to 1 µm. Ina case where the average particle diameter thereof is in the above-described range, the thermoplastic polymer particles are stably dispersed, the film hardness of the image recording layer is sufficiently held, and a non-image area with excellent hydrophilicity in which printing stain is unlikely to occur can be formed.

The inorganic particles are available as commercial products such as a colloidal silica dispersion product.

The content of the inorganic particles is preferably in a range of 1.0% by mass to 70% by mass and more preferably in a range of 5.0% by mass to 50% by mass with respect to the total mass of the image recording layer.

The image recording layer may contain a plasticizer in order to impart flexibility to a coated film. Examples of the plasticizer include polyethylene glycol, tributyl citrate, diethyl phthalate, dibutyl phthalate, dihexyl phthalate, dioctyl phthalate, tricresyl phosphate, tributyl phosphate, trioctyl phosphate, and tetrahydrofurfuryl oleate.

The content of the plasticizer is preferably in a range of 0.1% by mass to 50% by mass and more preferably in a range of 1% by mass to 30% by mass with respect to the total mass of the image recording layer.

In a case where polymer particles having a thermally reactive functional group (cross-linking group) are used for the image recording layer, a compound that initiates or promotes a reaction of the thermally reactive functional group (cross-linking group) can be added to the image recording layer as necessary. As the compound that initiates or promotes a reaction of the thermally reactive functional group, a compound that generates a radical or a cation due to heat may be exemplified. Examples of the compound include a lophine dimer, a trihalomethyl compound, a peroxide, an azo compound, onium salts including diazonium salts and diphenyl iodonium salts, acyl phosphine, and imide sulfonate. The addition amount of such a compound is preferably in a range of 1% by mass to 20% by mass and more preferably in a range of 1% by mass to 10% by mass with respect to the total mass of the image recording layer. In a case where the amount thereof is in the above-described range, on-press developability is not degraded and excellent effects for initiating or promoting a reaction are obtained.

<<Formation of Image Recording Layer C>>

The image recording layer C is formed by dissolving or dispersing each of the above-described required components in a suitable solvent to prepare a coating solution, coating a support with the coating solution directly or through an undercoat layer. As the solvent, water or a mixed solvent of water and an organic solvent is used, and a mixed solvent of water and an organic solvent is preferable from the viewpoint of the excellent surface state after coating. Since the amount of the organic solvent varies depending on the type of organic solvent, the amount thereof cannot be specified unconditionally, but the amount of the organic solvent in the mixed solvent is preferably in a range of 5% by volume to 50% by volume. Here, it is necessary that the amount of the organic solvent to be used is set to such that the thermoplastic polymer particles are not aggregated. The concentration of solid contents of the image recording layer coating solution is preferably in a range of 1% by mass to 50% by mass.

As the organic solvent used as a solvent of the coating solution, a water-soluble organic solvent is preferable. Specific examples thereof include alcohol solvents such as methanol, ethanol, propanol, isopropanol, or I-methoxy-2-propanol, ketone solvents such as acetone or methyl ethyl ketone, glycol ether solvents such as ethylene glycol dimethyl ether, γ-butyrolactone, N,N-dimethylformamide, N,N-dimethylacetamide, tetrahydrofuran, and dimethylsulfoxide. In particular, an organic solvent having a boiling point of 120° C. or lower and a solubility (amount of a solvent to be dissolved in 100 g of water) of 10 g or greater in water is preferable and an organic solvent having a solubility of 20 g or greater is more preferable.

As a coating method of the image recording layer coating solution, various methods can be used. Examples of the methods include a bar coater coating method, a rotary coating method, a spray coating method, a curtain coating method, a dip coating method, an air knife coating method, a blade coating method, and a roll coating method. The coating amount (solid content) of the image recording layer on the support obtained after the coating and the drying varies depending on the applications thereof, but is preferably in a range of 0.5 g/m$^2$ to 5.0 g/m$^2$ and more preferably in a range of 0.5 g/m$^2$ to 2.0 g/m$^2$.

Hereinafter, other constituent elements of the planographic printing plate precursor will be described.

<Protective Layer>

The planographic printing plate precursor according to the embodiment of the present disclosure may have a protective layer between the image recording layer and the overcoat layer. The protective layer has a function of suppressing an image formation-impairing reaction caused by oxygen shielding and additionally has a function of preventing the generation of scratches in the image recording layer and the ablation during exposure using high-illuminance lasers.

Protective layers having the above-described characteristics are described in, for example, the specification of U.S. Pat. No. 3,458,311A and JP1980-049729B (JP-S55-049729B). As poor oxygen-transmissible polymers which can be used for the protective layer, it is possible to appropriately select and use any one of water-soluble polymers or water-insoluble polymers, and if necessary, it is also possible to use two or more the polymers in a mixed form. Specific examples thereof include polyvinyl alcohols, modified polyvinyl alcohols, polyvinyl pyrrolidone, water-soluble cellulose derivatives, and poly(meth)acrylonitrile.

As the modified polyvinyl alcohols, acid-modified polyvinyl alcohols having carboxy groups or sulfo groups are preferably used. Specific examples thereof include modified-polyvinyl alcohols described in JP2005-250216A and JP2006-259137A.

The protective layer preferably includes an inorganic layered compound in order to enhance an oxygen-shielding property. The inorganic layered compound refers to particles having thin flat plate shapes, and examples thereof include mica groups such as natural mica and synthetic mica, talc represented by a formula 3MgO·4SiO·H$_2$O, taeniolite, montmorillonite, saponite, hectorite, and zirconium phosphate.

Mica compound is preferably used as the inorganic layered compound. Examples of the mica compound include mica groups such as natural mica and synthetic mica represented by Formula: A(B,C)$_{2.5}$D$_4$O$_{10}$(OH,F,O)$_2$ [here, A is at least one element selected from the group consisting of K, Na, and Ca, B and C are at least one element selected from the group consisting of Fe(II), Fc(III), Mn, Al, Mg, and V, and D is Si or Al].

In the mica groups, examples of the natural mica include muscovite, paragonite, phlogopite, biotite, and lepidolite. Examples of the synthetic mica include non-swelling micas such as fluorphlogopite $KMg_3(AlSi_3O_{10})F_2$ and potassium tetrasilic mica $KMg_{2.5}(Si_4O_{10})F_2$, and swelling micas Na tetrasilylic mica $NaMg_{2.5}(Si_4O_{10})F_2$, Na or Li taeniolite $(Na,Li)Mg_2Li(Si_4O_{10})F_2$, and montmorillonite-based Na or Li hectorite $(Na,Li)_{1/8}Mg_{2/5}Li_{1/8}(Si_4O_{10})F_2$. Furthermore, synthetic smectite is also useful.

Among the above-described mica compounds, fluorine-based swelling mica is particularly useful. That is, the swelling synthetic mica has a laminated structure consisting of a unit crystal lattice layer having a thickness of approximately 10 Å to 15 Å (angstrom, 1 Å=0.1 nm), and the metal atom substitution in the lattice thereof is significantly larger than that of other clay minerals. As a result, positive charges are deficient in the lattice layers, and cations such as $Li^+$, $Na^+$, $Ca^{2+}$, and $Mg^{2+}$ are adsorbed between the layers in order to compensate for the deficiency. Cations interposed between the layers are referred to as exchangeable cations and are exchangeable with various cations. In particular, in a case where the cations between the layers are $Li^+$ or $Na^+$, the ionic radius is small, and thus the bonds between layered crystal lattices are weak, and mica is significantly swollen by water. Cleavage easily occurs in a case of application of a shear force in this state, and a stabilized sol is formed in water. The swelling synthetic mica has a strong above-described tendency, and is particularly preferably used.

From the viewpoint of diffusion control, regarding the shapes of the mica compounds, the thickness is preferably thin, and the planar size is preferably large as long as the smoothness and active light ray-transmitting properties of coating surfaces are not impaired. Therefore, the aspect ratio is preferably 20 or higher, more preferably 100 or higher, and particularly preferably 200 or higher. The aspect ratio is the ratio of the long diameter to the thickness of a particle and can be measured from projection views obtained from the microphotograph of the particles. As the aspect ratio increases, the obtained effect is stronger.

Regarding the particle diameters of the mica compound, the average long diameter thereof is preferably in a range of 0.3 µm to 20 µm, more preferably in a range of 0.5 µm to 10 µm, and particularly preferably in a range of 1 µm to 5 µm. The average thickness of the particles is preferably 0.1 µm or smaller, more preferably 0.05 µm or smaller, and particularly preferably 0.01 µm or smaller. Specifically, for example, in the case of the swelling synthetic mica which is a typical compound, a preferred aspect has a thickness of approximately 1 nm to 50 nm and a surface size (long diameter) of approximately 1 µm to 20 µm.

The content of the inorganic layered compound is preferably in a range of 0% by mass to 60% by mass and more preferably in a range of 3% by mass to 50% by mass with respect to the total solid content of the protective layer. Even in a case where a plurality of types of inorganic layered compounds are used in combination, the total amount of the inorganic layered compounds is preferably the above-described content. In a case where the total amount is within the above-described range, oxygen-shielding property improves and excellent sensitivity can be obtained. In addition, the degradation of impressing property can be prevented.

The protective layer may contain known additives such as a plasticizer for imparting flexibility, a surfactant for improving coating property, and inorganic fine particles for controlling sliding property on the surface. In addition, the oil sensitizing agent described in the section of the image recording layer may be contained in the protective layer.

The protective layer is applied according to a known method. The coating amount (solid content) of the protective layer is preferably in a range of 0.01 $g/m^2$ to 10 $g/m^2$, more preferably in a range of 0.02 $g/m^2$ to 3 $g/m^2$, and particularly preferably in a range of 0.02 $g/m^2$ to 1 $g/m^2$.

<Undercoat Layer>

The planographic printing plate precursor according to the embodiment of the present disclosure may be provided with an undercoat layer between the image recording layer and the support as necessary. Since intimate attachment of the support to the image recording layer is stronger in an exposed area and the support is easily peeled off from the image recording layer in an unexposed area, the undercoat layer contributes to improvement of on-press developability without degrading printing durability. In addition, in a case of infrared (IR) laser exposure, the undercoat layer functions as a heat insulating layer so that a degradation in sensitivity due to heat, generated by the exposure, being diffused in the support is prevented.

Examples of the compound used for the undercoat layer include a silane coupling agent having an ethylenic double bond reactive group, which is an addition-polymerizable group, described in JP1998-282679A (JP-H10-282679A); and a phosphorus compound having an ethylenic double bond reactive group described in JP1990-304441A (JP-H02-304441A). Preferred examples thereof include polymer compounds having an adsorptive group, which can be adsorbed to the surface of the support, a hydrophilic group, and a cross-linking group, as described in JP2005-125749A and JP2006-188038A. As such a polymer compound, a copolymer of a monomer having an adsorptive group, a monomer having a hydrophilic group, and a monomer having a cross-linking group is preferable. Specific examples thereof include a copolymer of a monomer having an adsorptive group such as a phenolic hydroxy group, a carboxy group, $-PO_3H_2$, $-OPO_3H_2$, $-CONHSO_2-$, $-SO_2NHSO_2-$, or $-COCH_2COCH_3$, a monomer having a hydrophilic group such as a sulfo group, and a monomer having a polymerizable cross-linking group such as a methacryl group or an allyl group. The polymer compound may have a cross-linking group introduced by forming salts between a polar substituent of the polymer compound and a compound that includes a substituent having the opposite charge of the polar substituent and an ethylenically unsaturated bond. In addition, monomers other than the above-described monomers, preferably hydrophilic monomers may be further copolymerized.

The content of the ethylenically unsaturated bond in the polymer compound for an undercoat layer is preferably in a range of 0.1 mmol to 10.0 mmol and more preferably in a range of 2.0 mmol to 5.5 mmol per 1 g of the polymer compound.

The weight-average molecular weight of the polymer compound for an undercoat layer is preferably 5,000 or greater and more preferably in a range of 10,000 to 300,000.

For the purpose of preventing stain over time, the undercoat layer may contain a chelating agent, a secondary or tertiary amine, a polymerization inhibitor, a compound that includes an amino group or a functional group having polymerization inhibiting ability and a group interacting with the surface of an aluminum support, and the like (for example, 1,4-diazabicyclo[2.2.2]octane (DABCO), 2,3,5,6-tetrahydroxy-p-quinone, chloranil, sulfophthalic acid, hydroxyethyl ethylene diamine triacetic acid, dihydroxyethyl ethylene diamine diacetic acid, or hydroxyethyl imino diacetic acid) in addition to the compounds for an undercoat layer described above.

The undercoat layer is applied according to a known method. The coating amount of the undercoat layer in terms of a coating amount after drying is preferably in a range of 0.1 mg/m$^2$ to 100 mg/m$^2$ and more preferably in a range of 1 mg/m$^2$ to 30 mg/m$^2$.

The planographic printing plate precursor can be produced by applying a coating solution of each configuration layer according to a typical method, performing drying, and forming each configuration layer. The coating solution can be applied according to a die coating method, a dip coating method, an air knife coating method, a curtain coating method, a roller coating method, a wire bar coating method, a gravure coating method, or a slide coating method.

In addition, the overcoat layer is preferably formed of an aqueous coating solution including the particles and the water-soluble polymer.

(Planographic Printing Plate and Production Method Thereof and Planographic Printing Method)

The planographic printing plate according to the present disclosure is a planographic printing plate obtained by plate-making the planographic printing plate precursor according to the embodiment of the present disclosure.

The method of producing a planographic printing plate according to the embodiment of the present disclosure is not particularly limited as long as the method is a method of producing a planographic printing plate using the planographic printing plate precursor according to the embodiment of the present disclosure, and it is preferable that the method is a production method of plate-making a planographic printing plate using the planographic printing plate precursor according to the embodiment of the present disclosure and includes a step of image-wise exposing the planographic printing plate precursor according to the embodiment of the present disclosure to form an exposed area and an unexposed area (also referred to as an "image exposure step"); and a step of supplying at least one of printing ink or dampening water to remove a non-image area (also referred to as a "development treatment step").

The planographic printing method according to the present disclosure is a method of producing a planographic printing plate using the planographic printing plate precursor according to the embodiment of the present disclosure and performing printing and is also a production method of plate-making a planographic printing plate using the planographic printing plate precursor according to the embodiment of the present disclosure, and it is preferable that the method includes a step of image-wise exposing the planographic printing plate precursor according to the embodiment of the present disclosure to form an exposed area and an unexposed area (also referred to as an "image exposure step"); a step of supplying at least one of printing ink or dampening water to remove a non-image area (also referred to as a "development treatment step"); and a step of performing printing using the obtained planographic printing plate (also referred to as a "printing step").

In the planographic printing plate precursor according to the embodiment of the present disclosure, the development treatment step is performed without performing the image exposure step in a case of the key plate precursor.

<Image Exposure Step>

The image exposure of the planographic printing plate precursor can be performed in conformity with an image exposure operation for a typical planographic printing plate precursor.

The image exposure is performed by laser exposure through a transparent original picture having a line image, a halftone image, and the like or by laser beam scanning using digital data. The wavelength of a light source is preferably in a range of 700 nm to 1,400 nm. As the light source having a wavelength of 700 nm to 1,400 nm, a solid-state laser or a semiconductor laser that radiates infrared rays is suitable. The output of the infrared laser is preferably 100 mW or greater, the exposure time per one pixel is preferably within 20 μsec, and the irradiation energy quantity is preferably in a range of 10 mJ/cm$^2$ to 300 mJ/cm$^2$. For the purpose of reducing the exposure time, it is preferable to use a multi-beam laser device. The exposure mechanism may be any of an internal drum system, an external drum system, a flat bed system, and the like. The image exposure can be performed using a plate setter according to a usual method.

<Development Treatment Step>

The development treatment can be performed using a typical method. In a case of on-press development, a printing ink receiving unit having a lipophilic surface is formed by the image recording layer in the image area of the image recording layer in a case where at least one of dampening water and printing ink is supplied to the image-exposed planographic printing plate precursor on a printing press. Meanwhile, in a non-image area, a non-cured image recording layer is dissolved or dispersed by at least any of supplied dampening water and printing ink and then removed, a hydrophilic surface is exposed to the portion. As a result, dampening water adheres to the exposed hydrophilic surface, the printing ink is impressed on the image recording layer of the image area, and then the printing is started. Here, either of dampening water or printing ink may be initially supplied to the surface of the planographic printing plate precursor, but it is preferable that dampening water is initially supplied thereto so that the on-press developability is promoted by permeation of the dampening water.

In addition, since the planographic printing plate precursor according to the embodiment of the present disclosure has the overcoat layer on the outermost layer, permeation amount of dampening water into the image recording layer in the on-press development can be reduced, therefore detachment of the image recording layer during watering is unlikely to occur and excellent development scum-suppressing property is obtained. In addition, since the particles in the surface of the overcoat layer has high ink affinity, the planographic printing plate precursor according to the embodiment of the present disclosure is also suitably used in ink tack development which is one development method in on-press development, in which a non-image area is removed by sticking an ink roller.

<Printing Step>

The printing using the obtained planographic printing plate can be performed according to a typical method. The printing can be performed by supplying desired printing ink and dampening water, as necessary, to the planographic printing plate.

The amount of the printing ink and dampening water to be supplied is not particularly limited and may be appropriately set according to the desired printing.

The method of supplying the printing ink and dampening water to the planographic printing plate is not particularly limited and a known method can be used.

The planographic printing method according to the present disclosure may include known steps other than the above-described steps. Examples of other steps include a plate inspection step of confirming the position or orientation of the planographic printing plate precursor before each step and a confirmation step of confirming the printed image after the development treatment step.

-Development Treatment Using Developer-

In addition, a planographic printing plate can be produced from the planographic printing plate precursor according to the embodiment of the present disclosure through a development treatment using a developer by appropriately selecting the binder polymer or the like that is the constituent component of the image recording layer.

The method of producing a planographic printing plate according to the embodiment of the present disclosure preferably includes an exposure step of image-wise exposing the planographic printing plate precursor according to the embodiment of the present disclosure to form an exposed area and an unexposed area and a development step of supplying a developer having a pH of 2 or higher and 11 or lower to remove the unexposed area.

In addition, the planographic printing method according to the present disclosure preferably includes an exposure step of image-wise exposing the planographic printing plate precursor according to the embodiment of the present disclosure to form an exposed area and an unexposed area, a development step of supplying a developer having a pH of 2 or higher and 11 or lower to remove the unexposed area, and a step of performing printing using the obtained planographic printing plate.

The development treatment using a developer includes an aspect in which a developer including an alkaline agent and having a high pH of 14 or lower is used (also referred to as alkali development) and an aspect in which a developer containing at least one compound selected from the group consisting of a surfactant and a water-soluble polymer compound and having a pH of approximately 2 to 11 is used (also referred to as simple development). A preferred embodiment of the method of producing a planographic printing plate according to the embodiment of the present disclosure is an aspect in which a developer having a pH of approximately 2 to 11 is used.

In a development treatment of the related art in which an alkali developer is used, for example, the overcoat layer is removed by a pre-water washing step, next, alkali development (development treatment) is performed, alkali is removed by water washing in a post-water washing step, a gum solution treatment is performed, and drying is performed in a drying step. In contrast, in the method of producing a planographic printing plate according to the embodiment of the present disclosure, in a case where the planographic printing plate precursor has the overcoat layer and the protective layer, the protective layer is removed at the same time, and thus it is possible to omit the pre-water washing step.

In addition, it is also possible to perform development and a gum solution treatment step at the same time by adding a water-soluble polymer compound to the developer as necessary. Therefore, the post-water washing step is not particularly required, and it is also preferable to perform development and the gum solution treatment step by a single one-solution step and then perform a drying step described below. After the development treatment, it is preferable to remove the excess developer using a squeeze roller and then perform drying.

That is, in the development step of the method of producing a planographic printing plate according to the embodiment of the present disclosure, it is preferable to perform the development treatment and the gum solution treatment by a single one-solution step.

Development and the gum solution treatment being performed by a single one-solution step means that the development treatment and the gum solution treatment are not performed as separate steps, and, instead, the water-soluble polymer compound described below is added to the developer, and the development treatment and the gum solution treatment are performed in a single step using one solution which is the developer.

The development treatment in the present disclosure can be suitably performed using an automatic development treatment machine including unit for supplying the developer and a rubbing member. An automatic development treatment machine in which a rotary brush roll is used as the rubbing member is particularly preferable.

The number of the rotary brush rolls is preferably two or more. Furthermore, the automatic development treatment machine preferably includes, after development treatment unit, unit for removing the excess developer such as a squeeze roller and drying unit such as a hot-air device. In addition, the automatic development treatment machine may include, before the development treatment unit, preheating unit for performing a heating treatment on the planographic printing plate precursor after image exposure.

In a case of having the overcoat layer and the protective layer, a treatment in such an automatic development treatment machine has an advantage of being released from a need for so-called dealing with development scum derived from the protective layer/the image recording layer (photosensitive layer) which is generated in the case of on-press development treatment.

In the development step, in the case of a manual treatment, as a development treatment method, for example, a method in which sponge, absorbent cotton, or the like is soaked with an aqueous solution, the entire plate surface is treated while being rubbed and dried after the end of the treatment is suitably exemplified. In the case of an immersion treatment, for example, a method in which the planographic printing plate precursor is immersed and stirred for 60 seconds in a vat or deep tank containing an aqueous solution and then dried while being rubbed with absorbent cotton, sponge, or the like is suitably exemplified.

In the development treatment, a device having a simplified structure and simplified steps is preferably used.

In development treatments of the related art, the overcoat layer is removed by the pre-water washing step, next, development is performed using an alkaline developer, after that, alkali is removed in the post-water washing step, a gum treatment is performed in a gum pulling step, and drying is performed in the drying step.

As described above, in the present disclosure, development and gum pulling can be performed at the same time using one solution. Therefore, it is possible to omit the post-water washing step and the gum treatment step, and it is preferable to perform the drying step as necessary after development and gum pulling (gum solution treatment) are performed using one solution. As gum, polymers, more preferably, a water-soluble polymer compound and a surfactant are exemplified.

Furthermore, it is preferable to perform the removal of the overcoat layer, development, and gum pulling at the same time using one solution without performing the pre-water washing step. In addition, it is preferable to remove the excess developer using a squeeze roller after development and gum pulling, and then perform drying.

In the above-described removal step (development treatment step) in the present disclosure, a method of immersing the planographic printing plate precursor in the developer once may be used, or a method of immersing the planographic printing plate precursor in the developer twice or more may be used. Among these, the method of immersing the planographic printing plate precursor in the developer once or twice is preferably exemplified.

In the immersion, the exposed planographic printing plate precursor may be put into a developer tank in which the developer is stored or the developer is blown onto the plate surface of the exposed planographic printing plate precursor from a spray or the like.

In the present disclosure, even in a case of immersing the planographic printing plate precursor in the developer twice or more, a case where the planographic printing plate precursor is immersed in the same developer or the developer and a developer (fatigued solution) in which the components of the image recording layer are dissolved or dispersed by the development treatment twice or more is referred to as the development treatment using one solution (one-solution treatment).

In addition, in the development treatment, a rubbing member is preferably used, and a rubbing member such as a brush is preferably installed in a development bath for removing the non-image area of the image recording layer.

The development treatment in the present disclosure can be performed according to a usual method at a temperature of preferably at 0° C. to 60° C. and more preferably 15° C. to 40° C. by, for example, immersing the exposed planographic printing plate precursor in the developer and rubbing the planographic printing plate precursor with a brush or drawing a treatment liquid prepared in an external tank using a pump, blowing the developer from a spray nozzle, and rubbing the planographic printing plate precursor with the brush. The development treatment can be continuously performed a plurality of times. For example, the development treatment can be performed by drawing the developer prepared in an external tank using a pump, blowing the developer from a spray nozzle, rubbing the planographic printing plate precursor with the brush, then, again, blowing the developer from the spray nozzle, and rubbing the planographic printing plate precursor with the brush. In the case of performing the development treatment using an automatic developing machine, the developer is fatigued as the treatment amount increases, and thus it is preferable to restore the treatment capability by using a supplementary solution or a fresh developer.

In the development treatment in the present disclosure, a gum coater or an automatic developing machine known for the use for a presensitized plate (PS plate) and a computer to plate (CTP) in the related art can also be used. In the case of using the automatic developing machine, it is possible to apply any method of, for example, a method of treating the planographic printing plate precursor by drawing a developer prepared in a developer tank or a developer prepared in an external tank using a pump and blowing the developer from a spray nozzle, a method of treating the planographic printing plate precursor by immersing and transporting the printing plate in a tank filled with a developer using a guide roll in the developer or the like, or a so-called single-use treatment method of treating the planographic printing plate precursor by supplying only a necessary amount of a substantially unused developer to each plate. In any method, it is more preferable to use a rubbing mechanism such as a brush, molleton, or the like. For example, commercially available automatic developing machines (Clean Out Unit C85/C125, Clean-Out Unit+ C85/120, FCF 85V, FCF 125V, FCF News (manufactured by Glunz & Jensen), Azura CX85, Azura CX125, and Azura CX150 (manufactured by AGFA Graphics N.V.)) can be used. In addition, it is also possible to use a device into which a laser exposure unit and an automatic developing machine unit are integrally combined.

The details of each component of the developer used in the development step will be described below.

[pH]

The pH of the developer used in the present disclosure is 2 or higher and 11 or lower, preferably 5 or higher and 9 or lower, and more preferably 7 or higher and 9 or lower. From the viewpoint of developability and dispersibility of the image recording layer, it is advantageous to the value of the pH to be high. However, regarding printability, particularly, stain suppression, it is advantageous to set the value of the pH to be low.

In the present disclosure, the pH is a value measured at 25° C. using a pH meter (model No.: HM-31, manufactured by DKK-TOA Corporation).

[Surfactant]

The developer used in the present disclosure may contain a surfactant such as an anionic surfactant, a non-ionic surfactant, a cationic surfactant, and an amphoteric surfactant.

Among these, from the viewpoint of brush stain property, the developer preferably contains at least one selected from the group consisting of an anionic surfactant and an amphoteric surfactant.

In addition, the developer preferably contains a non-ionic surfactant and more preferably contains a non-ionic surfactant and at least one selected from the group consisting of an anionic surfactant and an amphoteric surfactant.

Preferred examples of the anionic surfactant include a compound represented by the Formula (I).

$$R^1-Y^1-X^1 \qquad (I)$$

In Formula (I), $R^1$ represents an alkyl group, a cycloalkyl group, an alkenyl group, an aralkyl group, or an aryl group, which may have a substituent.

As the alkyl group, for example, an alkyl group having 1 to 20 carbon atoms is preferable, and preferred specific examples thereof include a methyl group, an ethyl group, a propyl group, an n-butyl group, a sec-butyl group, a hexyl group, a 2-ethylhexyl group, an octyl group, a decyl group, a dodecyl group, a hexadecyl group, and a stearyl group.

The cycloalkyl group may be monocyclic or polycyclic. As the monocyclic cycloalkyl group, a monocyclic cycloalkyl group having 3 to 8 carbon atoms is preferable, and a cyclopropyl group, a cyclopentyl group, a cyclohexyl group, or a cyclooctyl group is more preferable. Preferred examples of the polycyclic cycloalkyl group include an adamantyl group, a norbornyl group, an isobornyl group, a camphanyl group, a dicyclopentyl group, an α-pinel group, and a tricyclodecanyl group.

As the alkenyl group, for example, an alkenyl group having 2 to 20 carbon atoms is preferable, and preferred specific examples thereof include a vinyl group, an allyl group, a butenyl group, and a cyclohexenyl group.

As the aralkyl group, for example, an aralkyl group having 7 to 12 carbon atoms is preferable, and preferred specific examples thereof include a benzyl group, a phenethyl group, and a naphthylmethyl group.

As the aryl group, for example, an aryl group having 6 to 15 carbon atoms is preferable, and preferred specific examples thereof include a phenyl group, a tolyl group, a dimethylphenyl group, a 2,4,6-trimethylphenyl group, a naphthyl group, an anthryl group, and a 9,10-dimethoxyanthryl group.

As the substituent, a monovalent nonmetallic atomic group excluding a hydrogen atom is used, and preferred examples thereof include a halogen atom (F, Cl, Br, or I), a hydroxy group, an alkoxy group, an aryloxy group, an acyl group, an amide group, an ester group, an acyloxy group, a carboxy group, a carboxylic acid anion group, and a sulfonic acid anion group.

As specific examples of the alkoxy group in the substituent, a methoxy group, an ethoxy group, a propyloxy group, an isopropyloxy group, a butyloxy group, a pentyloxy group, a hexyloxy group, a dodecyloxy group, a stearyloxy group, a methoxyethoxy group, a poly(ethyleneoxy) group, and a poly(propyleneoxy) group, respectively having 1 to 40 carbon atoms, are preferable; and these groups respectively having 1 to 20 carbon atoms are mom preferable. Examples of the aryloxy group include a phenoxy group, a tolyloxy group, a xylyloxy group, a mesityloxy group, a cumenyloxy group, a methoxyphenyloxy group, an ethoxyphenyloxy group, a chlorophenyloxy group, a bromophenyloxy group, and a naphthyloxy group, respectively having 6 to 18 carbon atoms. Examples of the acyl group include an acetyl group, a propanoyl group, a butanoyl group, a benzoyl group, and a naphthoyl group, respectively having 2 to 24 carbon atoms. Examples of the amide group include an acetamide group, a propionic acid amide group, a dodecanoic acid amide group, a palmitic acid amide group, a stearic acid amide group, a benzoic acid amide group, and a naphthoic acid amide group, respectively having 2 to 24 carbon atoms. Examples of the acyloxy group include an acetoxy group, a propanoyloxy group, a benzoyloxy group, and a naphthoyloxy group, respectively having 2 to 20 carbon atoms. Examples of the ester group include a methyl ester group, an ethyl ester group, a propyl ester group, a hexyl ester group, an octyl ester group, a dodecyl ester group, and a stearyl ester group, respectively having 1 to 24 carbon atoms. The substituent may be formed by consisting of a combination of two or more substituents described above.

$X^1$ represents a sulfonate group, a sulfate monoester group, a carboxylate group, or a phosphate group.

$Y^1$ represents a single bond, —$C_nH_{2n}$—, —$C_{n-m}H_{2(n-m)}OC_mH_{2n}$—, —O—($CH_2CH_2O)_n$—, —O—($CH_2CH_2CH_2O)_n$—, —CO—NH—, or a divalent linking group formed by consisting of a combination of two or more of these, in which the expressions of "n≥1" and "n≥m≥0" is satisfied.

Among examples of the compound represented by Formula (I), from the viewpoint of scratch and stain resistance, a compound represented by Formula (I-A) or Formula (I-B) is preferable.

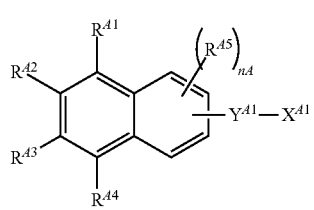

(I-A)

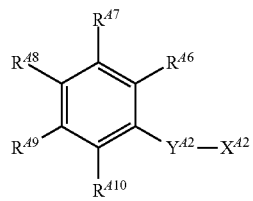

(I-B)

In Formulae (I-A) and (I-B), $R^{41}$ to $R^{410}$ each independently represent a hydrogen atom or an alkyl group, nA represents an integer of 1 to 3, $X^{41}$ and $X^{42}$ each independently represent a sulfonate group, a sulfate monoester group, a carboxylate group, or a phosphate group, and $Y^{41}$ and $Y^{42}$ each independently represent a single bond, —$C_nH_{2n}$—, —$C_{n-m}H_{2(n-m)}OC_mH_{2m}$—, —O—($CH_2CH_2O)_n$—, —O—($CH_2CH_2CH_2O)_n$—, —CO—NH—, or a divalent linking group formed by combining two or more of these, in which the expressions of "n≥1" and "n≥m≥0" is satisfied. The sum total number of carbon atoms in $R^{41}$ to $R^{45}$ or $R^{46}$ to $R^{410}$, and $Y^{41}$ or $Y^{42}$ is 3 or greater.

The total number of carbon atoms in $R^{41}$ to $R^{45}$ and $Y^{41}$, or $R^{46}$ to $R^{410}$ and $Y^{42}$ in the compound represented by Formula (I-A) or Formula (I-B) is preferably 25 or less and more preferably in a range of 4 to 20. The structure of the above-described alkyl group may be linear or branched.

It is preferable that $X^{41}$ and $X^{42}$ in the compound represented by Formula (I-A) or Formula (I-B) represent a sulfonate group or a carboxylate group. In addition, the salt structure in $X^{41}$ and $X^{42}$ is preferable, from the viewpoint that the solubility of the alkali metal salt in a water-based solvent is particularly excellent. Among the salt structures, a sodium salt or a potassium salt is particularly preferable.

As the compound represented by Formula (i-A) or Formula (I-B), the description in paragraphs 0019 to 0037 of JP2007-206348A can be referred to.

As the anionic surfactant, the compounds described in paragraphs 0023 to 0028 of JP2006-065321A can be suitably used.

The amphoteric surfactant used for the developer according to the present disclosure is not particularly limited, and examples thereof include an amine oxide-based surfactant such as alkyl dimethylamine oxide; a betaine-based surfactant such as alkyl betaine, fatty acid amide propyl betaine, or alkyl imidazole; and an amino acid-based surfactant such as sodium alkylamino fatty acid.

In particular, alkyl dimethylamine oxide which may have a substituent, alkyl carboxy betaine which may have a substituent, or alkyl sulfobetaine which may have a substituent is preferably used. Specific examples thereof include compounds represented by Formula (2) in paragraph 0256 of JP2008-203359A, compounds represented by Formulae (I), Formula (11), and Formula (VI) in paragraph 0028 of JP2008-276166A, and compounds described in paragraphs 0022 to 0029 of JP2009-047927A.

As an amphoteric ion-based surfactant used for the developer, a compound represented by Formula (I) or a compound represented by Formula (2) is preferable.

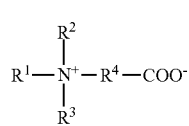

(1)

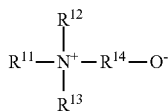

(2)

In Formulae (I) and (2), $R^1$ and $R^{11}$ each independently represent an alkyl group having 8 to 20 carbon atoms or an alkyl group having a linking group, which has 8 to 20 carbon atoms in total.

$R^2$, $R^3$, $R^{12}$, and $R^{13}$ each independently represent a hydrogen atom, an alkyl group, or a group containing an ethylene oxide group.

$R^4$ and $R^{14}$ each independently represent a single bond or an alkylene group.

In addition, two groups among $R^1$, $R^2$, $R^3$, and $R^4$ may be bonded to each other to form a ring structure, and two groups among $R^{11}$, $R^{12}$, $R^{13}$, and $R^{14}$ may be bonded to each other to form a ring structure.

In the compound represented by Formula (I) or the compound represented by Formula (2), the hydrophobic portion is bigger as the total number of carbon atoms increases, and the solubility in a water-based developer is decreased. In this case, the solubility is improved by mixing an organic solvent such as alcohol that assists dissolution with water as a dissolution assistant, but the surfactant cannot be dissolved within a proper mixing range in a case where the total number of carbon atoms is extremely large. Accordingly, the sum total number of carbon atoms of $R^1$ to $R^4$ or $R^{11}$ to $R^{14}$ is preferably in a range of 10 to 40 and more preferably in a range of 12 to 30.

The alkyl group having a linking group represented by $R^1$ or $R^{11}$ has a structure in which a linking group is present between alkyl groups. In other words, in a case where one linking group is present, the structure can be represented by "-alkylene group-linking group-alkyl group". Examples of the linking group include an ester bond, a carbonyl bond, and an amide bond. The structure may have two or more linking groups, but it is preferable that the structure has one linking group, and an amide bond is particularly preferable. The total number of carbon atoms of the alkylene group bonded to the linking group is preferably in a range of 1 to 5. The alkylene group may be linear or branched, but a linear alkylene group is preferable. The number of carbon atoms of the alkyl group bonded to the linking group is preferably in a range of 3 to 19, and the alkyl group may be linear or branched, but a linear alkyl is preferable.

In a case where $R^2$ or $R^{12}$ represents an alkyl group, the number of carbon atoms thereof is preferably in a range of 1 to 5 and particularly preferably in a range of 1 to 3. The alkyl group may be linear or branched, but a linear alkyl group is preferable.

In a case where $R^3$ or $R^{13}$ represents an alkyl group, the number of carbon atoms thereof is preferably in a range of 1 to 5 and particularly preferably in a range of 1 to 3. The alkyl group may be linear or branched, but a linear alkyl group is preferable.

Examples of the group containing an ethylene oxide represented by $R^3$ or $R^{13}$ include a group represented by $-R^a(CH_2CH_2O)_nR^b$. Here, $R^a$ represents a single bond, an oxygen atom, or a divalent organic group (preferably having 10 or less carbon atoms), $R^b$ represents a hydrogen atom or an organic group (preferably having 10 or less carbon atoms), and n represents an integer of 1 to 10.

In a case where $R^4$ and $R^{14}$ represents an alkylene group, the number of carbon atoms thereof is preferably in a range of 1 to 5 and particularly preferably in a range of 1 to 3. The alkylene group may be linear or branched, but a linear alkylene group is preferable.

The compound represented by Formula (I) or the compound represented by Formula (2) preferably has an amide bond and more preferably has an amide bond as a linking group of $R^1$ or $R^{11}$.

Representative examples of the compound represented by Formula (1) or the compound represented by Formula (2) are as follows, but the present disclosure is not limited thereto.

I-a)
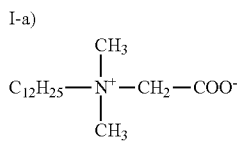

I-b)
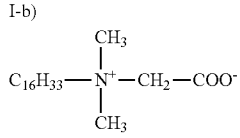

I-c)
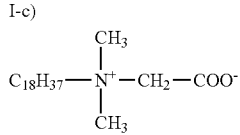

I-d)
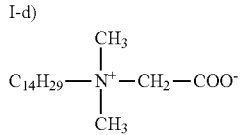

I-e)
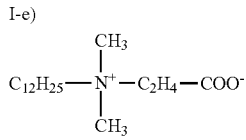

I-f)
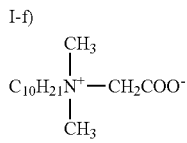

I-g)
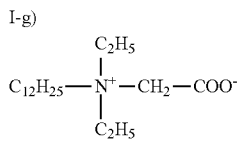

I-h)
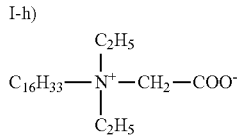

I-i)
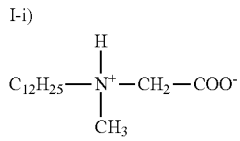

I-j)
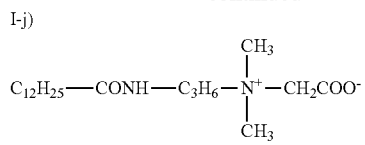

I-k)
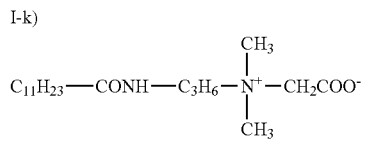

I-l)
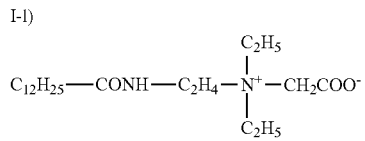

I-m)
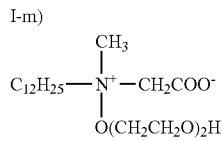

I-n)
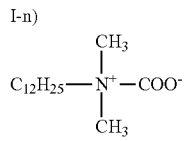

I-o)
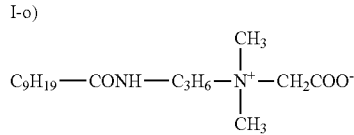

I-p)
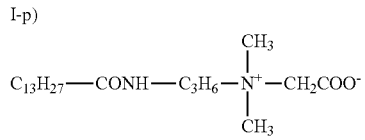

I-q)
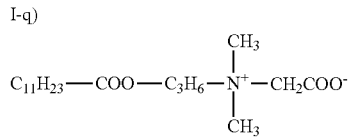

II-a)
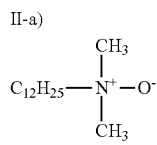

II-b)
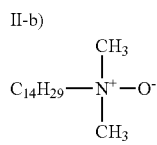

II-c)
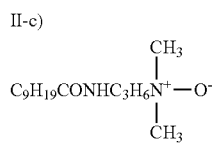

II-d)
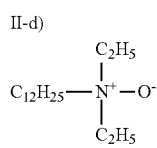

II-e)
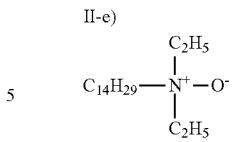

II-f)
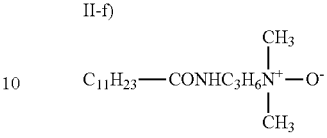

II-g)
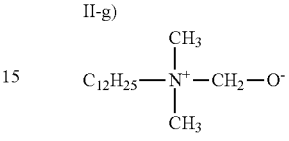

The compound represented by Formula (I) or Formula (2) can be synthesized according to a known method. In addition, commercially available products maybe used. Examples of the commercially available products of the compound represented by formula (1) include SOFRAZOLINE LPB, SOFTAZOLINE LPB-R, and VISTA MAP (manufactured by Kawakeni Fine Chemicals Co., Ltd.), and TAKFSAAF C-157L (manufactured by TAKEMOTO OIL & FAT Co., Ltd.). Examples of the commercially available products of the compound represented by Formula (2) include SOFTAZOLINE LAO (manufactured by Kawaken Fine Chemicals Co., Ltd.) and AMOGEN AOL (manufactured by DKS Co., Ltd.).

The amphoteric ion-based surfactant may be used alone or in combination of two or more kinds thereof in a developer.

Examples of non-ionic surfactant include polyoxyethylene alkyl ethers, polyoxyethylene alkyl phenyl ethers, polyoxyethylene polystyryl phenyl ether, glycerin fatty acid partial esters, sorbitan fatty acid partial esters, pentaerythritol fatty acid partial esters, propylene glycol monofatty acid ester, sucrose fatty acid partial ester, polyoxyethylene sorbitan fatty acid partial esters, polyoxyethylene sorbitol fatty acid partial esters, polyethylene glycol fatty acid esters, polyglycerin fatty acid partial esters, polyoxyethylene glycerin fatty acid partial esters, polyoxyethylene diglycerins, fatty acid diethanolamides, N,N-bis-2-hydroxyalkylamines, polyoxyethylene alkylamine, triethanolamine fatty acid ester, trialkylamine oxide, polyoxyethylene alkyl phenyl ethers, and polyoxyethylene-polyoxypropylene block copolymers.

In addition, acetylene glycol-based and acetylene alcohol-based oxyethylene adducts, and fluorine-based surfactants can also be used. These surfactants can be used in combination of two or more kinds thereof.

Particularly preferred examples of the non-ionic surfactant include a non-ionic aromatic ether-based surfactant represented by Formula (N1).

In the formula, $X^N$ represents an aromatic group which may have a substituent, $Y^N$ represents a single bond or an alkylene group having 1 to 10 carbon atoms, $A^1$ and $A^2$ are different groups and represent any of —CH$_2$CH$_2$O— or —CH$_2$CH(CH$_3$)O—, and nB and mB each independently represent an integer of 0 to 100, provided that both of nB and mB is not 0 at the same time, and both of nB and mB is not 1 in a case where any one of nB or mB is 0.

In the formula, examples of the aromatic group of $X^N$ include a phenyl group, a naphthyl group, and an anthranyl group. These aromatic groups may have a substituent. Examples of the substituent include an organic group having 1 to 100 carbon atoms. In the formula, the compound may be a random or block copolymer in a case where both $A^1$ and $A^2$ are present.

Specific examples of the organic group having 1 to 100 carbon atoms include aliphatic hydrocarbon groups or aromatic hydrocarbon groups, which may be saturated or unsaturated and may be linear or branched, such as an alkyl group, an alkenyl group, an alkynyl group, an aryl group, an aralkyl group, an alkoxy group, an aryloxy group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an acylamino group, an N-alkylacylamino group, an N-arylacylamino group, an acyl group, an alkoxycarbonylamino group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, a polyoxyalkylene chain, and the above-described organic group to which a polyoxyalkylene chain is bonded. The alkyl group may be linear or branched.

In addition, as the non-ionic surfactant, compounds described in paragraphs 0030 to 0040 of JP2006-065321A can also be suitably used.

The cationic surfactant is not particularly limited, and known surfactants of the related art can be used. Examples thereof include alkylamine salts, quaternary ammonium salts, alkylimidazolium salts, polyoxyethylene alkylamine salts, and polyethylene polyamine derivatives.

The surfactant may be used alone or in combination of two or more kinds thereof.

The content of the surfactant is preferably in a range of 1% by mass to 25% by mass, more preferably in a range of 2% by mass to 20% by mass, still more preferably in a range of 3% by mass to 15% by mass, and particularly preferably in a range of 5% by mass to 10% by mass with respect to the total mass of the developer. In a case where the content thereof is in the above-described range, scratch and stain resistance is excellent, the dispersibility of the development scum is excellent, and the inking property of a planographic printing plate to be obtained is excellent.

[Water-Soluble Polymer Compound]

The developer used in the present disclosure is capable of containing a water-soluble polymer from the viewpoint of the viscosity adjustment of the developer and the protection of the plate surface of a planographic printing plate to be obtained.

Examples of the water-soluble polymer include a water-soluble polymer compound such as soybean polysaccharides, modified starch, gum arabic, dextrin, a fiber derivative (such as carboxymethyl cellulose, carboxyethyl cellulose, or methyl cellulose) and a modified product thereof, pullulan, polyvinyl alcohol and a derivative thereof, a copolymer of polyvinylpyrrolidone, polyacrylamide and acrylamide, a vinyl methyl ether/maleic anhydride copolymer, a vinyl acetate/maleic anhydride copolymer, and a styrene/maleic anhydride copolymer.

As the soybean polysaccharides, soybean polysaccharides which have been known in the related art can be used. For example, SOYAFIBE (trade name, manufactured by FUJI OIL. CO., LTD.) can be used as a commercially available product, and various grades of products can be used. Preferred examples thereof include products in which the viscosity of a 10% by mass aqueous solution is in a range of 10 mPa·s to 100 mPa·s.

As the modified starch, starch represented by Formula (III) is preferable. Any of starch such as corn, potato, tapioca, rice, or wheat can be used as the starch represented by Formula (III). The modification of the starch can be performed according to a method of decomposing the starch with an acid or an enzyme to have 5 to 30 glucose residues per one molecule and adding oxypropylene thereto in an alkali.

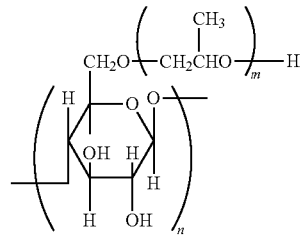

(III)

In the formula, the etherification degree (degree of substitution) is in a range of 0.05 to 1.2 per glucose unit, n represents an integer of 3 to 30, and m represents an integer of 1 to 3.

Among the examples of the water-soluble polymer compound, soybean polysaccharides, modified starch, gum arabic, dextrin, carboxymethyl cellulose, and polyvinyl alcohol are particularly preferable.

The water-soluble polymer compound can be used in combination of two or more kinds thereof.

It is preferable that the developer does not contain the water-soluble polymer compound or the content of the water-soluble polymer compound is more than 0% by mass and 1% by mass or less with respect to the total mass of the developer, it is more preferable that the developer does not contain the water-soluble polymer compound or the content of the water-soluble polymer compound is more than 0% by mass and 0.1% by mass or less with respect to the total mass of the developer, it is still more preferable that the developer does not contain the water-soluble polymer compound or the content of the water-soluble polymer compound is more than 0% by mass and 0.05% by mass or less with respect to the total mass of the developer, and it is particularly preferable that the developer does not contain the water-soluble polymer compound. In the case of the above-described aspect, the viscosity of the developer is appropriate, and it is possible to suppress the development scum or the like being deposited on a roller member of the automatic developing machine.

Other Additives

The developer used in the present disclosure may contain a wetting agent, a preservative, a chelate compound, an antifoaming agent, an organic acid, an organic solvent, an inorganic acid, and an inorganic salt in addition to those described above.

Suitable examples of the wetting agent include ethylene glycol, propylene glycol, triethylene glycol, butylene glycol, hexylene glycol, diethylene glycol, dipropylene glycol, glycerin, glycerin, trimethylolpropane, and diglycerin. The wetting agent may be used alone or in combination of two or more kinds thereof. The content of the wetting agent is preferably in a range of 0.1% by mass to 5% by mass with respect to the total mass of the developer.

As the preservative, phenol or a derivative thereof, formalin, an imidazole derivative, sodium dehydroacetate, a 4-isothiazolin-3-one derivative, benzisothiazolin-3-one. 2-methyl-4-isothiazolin-3-one, a benzotriazole derivative, an amidizing anidine derivative, quaternary ammonium salts, derivatives of pyridine, quinoline, and guanidine, diazine, a triazole derivative, oxazole, an oxazine derivative, nitrobromoalcohol such as 2-bromo-2-nitropropene-1,3-diol, 1,1-dibromo-1-nitro-2-ethanol, and 1,1-dibromo-1-nitro-2-propanol, and the like can be preferably used.

The addition amount of the preservative is an amount of stably exhibiting the efficacy for bacteria, molds, yeasts, or the like, and is preferably in a range of 0.01% by mass to 4% by mass with respect to the total mass of the developer, even though the amount thereof varies depending on the type of bacteria, molds, and the yeasts. In addition, two or more preservatives are preferably used in combination so that there is efficacy for a variety of molds and bacteria.

Examples of the chelate compound include ethylenediaminetetraacetic acid, a potassium salt thereof, and a sodium salt thereof; diethylenetriaminepentaacetic acid, a potassium salt thereof, and a sodium salt thereof; triethylenetetraminehexaacetic acid, a potassium salt thereof a sodium salt thereof; hydroxyethylethylenediaminetriacetic acid, a potassium salt thereof, and a sodium salt thereof; nitrilotriacetic acid and a sodium salt thereof; 1-hydroxyethane-1,1-diphosphonic acid, a potassium salt thereof, and a sodium salt thereof; and organic phosphonic acids such as amino tri (methylenephosphonic acid), a potassium salt thereof, and sodium salt thereof. Instead of the sodium salt and the potassium salt of the chelating agent, a salt of an organic amine is also effective.

These chelating agents are preferably a chelating agent that is stably present in a treatment liquid composition and does not impair printability. The content of the chelating agent is preferably in a range of 0.001% by mass to 1.0% by mass with respect to the total mass of the developer.

As the antifoaming agent, it is possible to use a typical silicone-based self-emulsification type, emulsification type, or non-ionic compound having a hydrophilic-lipophilic balance (HLB) of 5 or lower or the like. A silicone antifoaming agent is preferable.

In the present disclosure, a silicone-based surfactant is regarded as the antifoaming agent.

The content of the antifoaming agent is suitably in a range of 0.001% by mass to 1.0% by mass with respect to the total mass of the developer.

Examples of the organic acid include citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid, and organic phosphonic acid. The organic acid can be used in the form of an alkali metal salt or ammonium salt thereof. The content of the organic acid is preferably in a range of 0.01% by mass to 0.5% by mass with respect to the total mass of the developer.

Examples of a containable organic solvent include aliphatic hydrocarbons (hexane, heptane, "ISOPAR E, H, G" (manufactured by Exxon Mobil Corporation), gasoline, kerosene, and the like), aromatic hydrocarbons (toluene, xylene, and the like), halogenated hydrocarbon (methylene dichloride, ethylene dichloride, trichlene, monochlorobenzene, and the like), and polar solvents.

Examples of the polar solvent include alcohols (such as methanol, ethanol, propanol, isopropanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methyl phenyl carbinol, n-amyl alcohol, and methyl amyl alcohol), ketones (such as acetone, methyl ethyl ketone, ethyl butyl ketone, methyl isobutyl ketone, and cyclohexanone), esters (such as ethyl acetate, propyl acetate, butyl acetate, amyl acetate, benzyl acetate, methyl lactate, butyl lactate, ethylene glycol monobutyl acetate, propylene glycol monomethyl ether acetate, diethylene glycol acetate, diethyl phthalate, and butyl levulinate), and others (such as triethyl phosphate, tricresyl phosphate, N-phenylethanolamine, and N-phenyldiethanolamine).

In a case where the organic solvent is insoluble in water, the organic solvent can be used by being solubilized in water using a surfactant or the like. In a case where the developer contains an organic solvent, from the viewpoints of safety and inflammability, the concentration of the solvent in the developer is preferably less than 40% by mass.

Examples of the inorganic acid and inorganic salt include phosphoric acid, methacrylic acid, primary ammonium phosphate, secondary ammonium phosphate, primary sodium phosphate, secondary sodium phosphate, primary potassium phosphate, secondary potassium phosphate, sodium tripolyphosphate, potassium pyrophosphate, sodium hexametaphosphate, magnesium nitrate, sodium nitrate, potassium nitrate, ammonium nitrate, sodium sulfate, potassium sulfate, ammonium sulfate, sodium sulfite, ammonium sulfite, sodium hydrogensulfate, and nickel sulfate. The content of the inorganic salt is preferably in a range of 0.01% by mass to 0.5% by mass with respect to the total mass of the developer.

The developer used in the present disclosure is obtained by dissolving or dispersing each of the above-described components in water as necessary. The concentration of solid contents of the developer is preferably in a range of 2% by mass to 25% by mass. In addition, the developer can be used by preparing a concentrated solution and diluting the concentrate with water before use.

In addition, it is preferable that the developer used in the present disclosure is an aqueous developer.

In addition, from the viewpoint of the dispersibility of the development scum, the developer used in the present disclosure preferably contains an alcohol compound.

Examples of the alcohol compound include methanol, ethanol, propanol, isopropanol, and benzyl alcohol. Among these, benzyl alcohol is preferable.

From the viewpoint of dispersibility of the development scum, the content of the alcohol compound is preferably in a range of 0.01% by mass to 5% by mass, more preferably in a range of 0.1% by mass to 2% by mass, and particularly preferably in a range of 0.2% by mass to 1% by mass with respect to the total mass of the developer.

EXAMPLES

Hereinafter, the present disclosure will be described in detail with reference to examples, but the present disclosure is not limited thereto. In the present examples, "%" and "parts" respectively indicate "% by mass" and "parts by mass" unless otherwise specified. In a polymer compound, the molecular weight indicates the weight-average molecular weight (Mw) unless otherwise specified.

Examples 1 to 53 and Comparative Examples 1 to 4

<Production of Support>

In order to remove rolling oil on the surface of a 0.3 mm-thick aluminum plate (material JIS A 1050), a defatting treatment was performed thereon using a 10% by mass aqueous solution of sodium aluminate at 50° C. for 30 seconds, and then the surface of the aluminum plate was grained using three implanted nylon brushes having a hair diameter of 0.3 mm and a suspension of an abrading agent (pumice) and water, which has a specific gravity of 1.1 g/cm and a median diameter of 25 μm, and well washed with water. The aluminum plate was etched by being immersed in a 25% by mass aqueous solution of sodium hydroxide at 45° C. for 9 seconds, washed with water, further immersed in a 20% by mass nitric acid aqueous solution at 60° C. for 20 seconds, and then washed with water. The etching amount of the grained surface was approximately 3 g/m².

Next, an electrochemical roughening treatment was continuously performed using an AC voltage of 60 Hz. An electrolyte was a 1% by mass aqueous solution of nitric acid (including 0.5% by mass of aluminum ions), and the solution temperature was 50° C. Using a trapezoidal rectangular waveform AC having a time TP, until the current value reached a peak from zero, of 0.8 ms and the duty ratio of 1:1 as the AC power source waveform, the electrochemical roughening treatment was performed using a carbon electrode as a counter electrode. As an auxiliary anode, ferrite was used. The current density was 30 A/dm² as the peak current value, and 5% of the current from the power source separately flowed to the auxiliary anode. The electric quantity in nitric acid electrolysis was 175 C/dm² as the electric quantity in a case of anodization of the aluminum plate. Thereafter, washing with water by spraying was performed.

Next, an electrochemical roughening treatment was performed according to the same method as that for the nitric acid electrolysis using a 0.5% by mass of hydrochloric acid aqueous solution (containing 0.5% by mass of aluminum ions) and an electrolyte having a solution temperature of 50° C. under a condition of an electric quantity of 50 C/dm² in a case of anodization of the aluminum plate, and washing with water was performed using a spray.

Next, 2.5 g/m² of a DC anodized film was formed on the aluminum plate at a current density of 15 A/dm² using a 15% by mass aqueous solution of sulfuric acid (including 0.5% by mass of aluminum ions) as an electrolyte and then washed with water and dried, thereby producing a support. The average pore diameter in the surface layer of the anodized film (that is, the surface average pore diameter) was 10 nm.

The pore diameter in the surface layer of the anodized film was measured using a method in which the surface was observed an ultrahigh resolution SEM (S-900 manufactured by Hitachi, Ltd.) at a relatively low acceleration voltage of 12 V at a magnification of 150,000 times without carrying out a vapor deposition treatment or the like for imparting conductive properties, 50 pores were randomly extracted, and the average value was obtained. The standard deviation was ±10% or less of the average value.

<Formation of Planographic Printing Plate Precursor>

The support was coated with an undercoating solution (1) having the following composition so that a dried coating amount was set to 20 mg/m² and dried in an oven at 100° C. for 30 seconds, thereby producing a support having an undercoat layer.

The undercoat layer was bar-coated with the following image recording layer coating solution and dried in the oven at 100° C. for 60 seconds, thereby forming an image recording layer having a dried coating amount of 1.0 g/m².

The image recording layer was further coated with an overcoat layer coating solution having the following composition and dried in an oven at 100° C. for 60 seconds, thereby forming an overcoat layer (including a hydrophobic area) having a dried coating amount of 0.1 g/m² and thus obtaining a planographic printing plate precursor.

[Undercoating Solution (1)]

Undercoating compound 1 described below: 0.18 parts
Methanol: 55.24 parts
Distilled water: 6.15 parts -Synthesis of Undercoating Compound 1-

<<Purification of monomer M-1>>

LIGHT ESTER P-1M (2-methacryloyloxyethyl acid phosphate, manufactured by Kyoeisha Chemical Co., Ltd.) (420 parts), diethylene glycol dibutyl ether (1,050 parts), and distilled water (1,050 parts) were added to a separating funnel, strongly stirred, and then allowed to stand. The upper layer was disposed of, diethylene glycol dibutyl ether (1,050 parts) was added thereto, and the components were strongly stirred and then allowed to stand. The upper layer was disposed of, thereby obtaining an aqueous solution of a monomer M-1 (1,300 parts, 10.5% by mass expressed in terms of solid contents).

Distilled water (53.73 parts) and the monomer M-2(3.66 parts) shown below were added to a three-neck flask and heated to 55° C. in a nitrogen atmosphere. Next, the dropping solution 1 described below was added dropwise thereto for two hours, the components were stirred for 30 minutes. VA-046B (manufactured by Wako Pure Chemical Industries Ltd.)(0.386 parts) was added thereto, and then the components were heated to 80° C. and stirred for 1.5 hours. The reaction solution was returned to room temperature (25° C.), a 30% by mass aqueous solution of sodium hydroxide was added thereto so as to adjust pH to 8.0, and then 4-hydroxy-2,2,6,6-tetramethylpiperidine-1-oxyl (4-OH-TEMPO, 0.005 parts) was added thereto. An aqueous solution of an undercoating compound 1 (180 parts) was obtained by the above-described operation. The weight-average molecular weight (Mw) in terms of polyethylene glycol value by the gel permeation chromatography (GPC) method was 170,000.

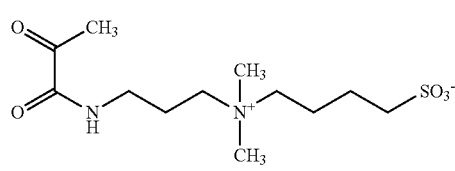

Monomer M-2

<<Dropping solution 1>>

Aqueous solution of the monomer M-1 described above: 87.59 parts
Monomer M-2 described above: 14.63 parts
VA-046B (2,2'-azobis[2-(2-imidazolin-2-yl)propane] disulfate dehydrate, manufactured by Wako Pure Chemical Industries Ltd.): 0.386 parts
Distilled water: 20.95 parts <Image Recording Layer Coating Solution (1)>
  Polymerizable compound 1[*1]: 0.15 parts
  Polymerizable compound 2[*2]: 0.1 parts
  Graft copolymer 2[*3]: 0.825 parts
  Klucel M[*4]: 0.020 parts
  Irgacure 250[*5]: 0.032 parts
  Infrared absorbent (1)(the following structure): 0.02 parts
  Sodium tetraphenylborate: 0.03 parts
  Byk 336[*6]: 0.015 parts
  Black-XV[*7]: 0.04 parts
  n-propanol: 7.470 parts
  Water: 1.868 parts
  *1: UA510H (manufactured by Kyoeisha Chemical Co., Ltd; reaction product of dipentaerythritol pentaacrylate and hexamethylene diisocyanate)
  *2: ATM-4E (manufactured by Shin-Nakamura Chemical Co., Ltd.; ethoxylated pentaerythritol tetraacrylate)
  *3: the graft copolymer 2 is a polymer particle of a graft copolymer of poly(ethylene glycol) methyl ether methacrylate, styrene, and acrylonitrile at a mixing ratio of 10:9:81, and a dispersion containing 24% by mass of the polymer particles in a solvent containing n-propanol and water at a mass ratio of 80:20 is used. In addition, the volume average particle diameter is 193 nm.
  *4: Klucel M means hydroxypropyl cellulose available from Hercules.
  *5: Irgacure 250 is a 75% solution of iodonium, (4-methylphenyl)[4-(2-methylpropyl)phenyl]-, hexafluorophosphate in propylene carbonate that can be procured from Ciba Specialty Chemicals Inc.
  *6: Byk 336 is a modified dimethyl polysiloxane copolymer which is commercially available from BYK-Chemie Japan K. K., in a 25% xylene/methoxypropyl acetate solution.
  *7: Black-XV (manufactured by Yamamoto Chemicals Inc.)

Infrared absorbent (1)

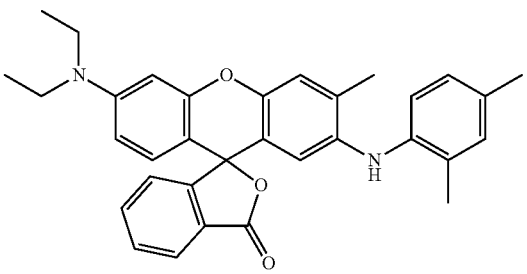

Black-XV

<Image Recording Layer Coating Solution (2)>
  Binder polymer (1) [the following structure]: 0.240 pans
  Infrared absorbent (2) [the following structure]: 0.030 parts
  Polymerization initiator (1) [the following structure]: 0.162 parts
  Polymerizable compound (tris(acryloyloxyethyl) isocyanurate, NK ESTER A-9300, manufactured by Shin-Nakamura Chemical Co., Ltd.): 0.192 parts
  Tris(2-hydroxyethyl) isocyanurate: 0.062 parts
  Benzyl-dimethyl-octyl ammonium·PF$_6$ salt: 0.018 parts
  Ammonium group-containing polymer [a structure of the following reference sign (15)]: 0.010 parts
  Fluorine-based surfactant (1) [the following structure]: 0.008 parts
  Methyl ethyl ketone: 1.091 parts
  1-methoxy-2-propanol: 8.609 parts
  Microgel solution (1): 5.065 parts
  A method of preparing a microgel (1) used for the preparation of the microgel solution (1) will be described below.

<Preparation of Polyvalent Isocyanate Compound (1)>
  0.043 parts of bismuth tris(2-ethylhexanoate) (NEOSTANN U-600, manufactured by NITTO KASEI CO., LTD.) was added to an ethyl acetate (25.31 parts) suspension solution of 17.78 parts of isophorone diisocyanate and 7.35 parts of the following polyhydric phenol compound (1), and the solution was stirred. The reaction temperature was set to 50° C. in a case of heat generation being subsided, and the solution was stirred for 3 hours, thereby obtaining an ethyl acetate solution (50% by mass) of a polyvalent isocyanate compound (1).

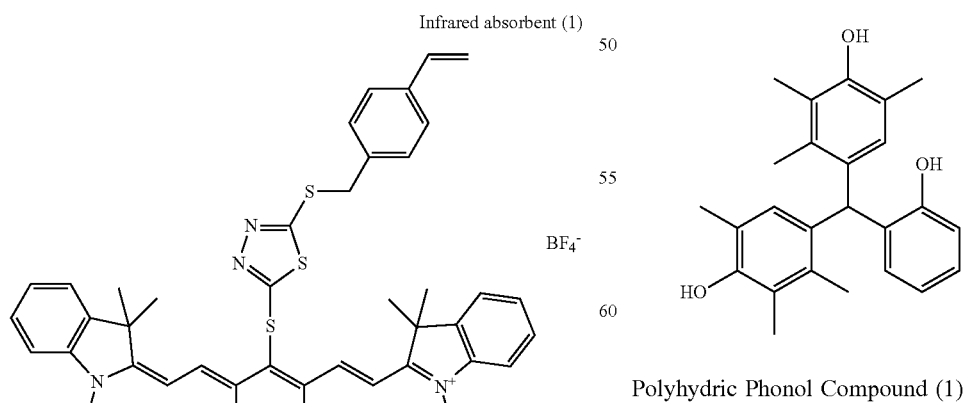

Polyhydric Phonol Compound (1)

<Preparation of Microgel (1)>
  The following oil phase components and the water phase component were mixed with each other and emulsified at 12,000 rpm (revolution per minute) for 10 minutes using a homogenizer. The obtained emulsion was stirred at 45° C. for 4 hours, 5.20 parts of a 10% by mass of aqueous solution of 1,8-diazabicyclo[5.4.0]undeca-7-ene-octylate (U-CAT SA102, manufactured by San-Apro Ltd.) was added thereto, and the solution was stirred at room temperature for 30 minutes and allowed to stand at 45° C. for 24 hours. Adjustment was made using distilled water so that the concentration of the solid content reached 20% by mass, thereby obtaining an aqueous dispersion liquid of a microgel (1). The average particle diameter was measured by a light scattering method and found out to be 0.28 μm.

(Oil Phase Components)
- (Component 1) ethyl acetate: 12.0 parts
- (Component 2) adduct (50% by mass of ethyl acetate solution, manufactured by Mitsui Chemicals, Inc.) obtained by adding trimethylolpropane (6 mol equivalent) and xylene diisocyanate (18 mol equivalent) and adding methyl one-terminal polyoxyethylene (1 mol equivalent, repetition number of oxyethylene units: 90) thereto: 3.76 parts
- (Component 3) polyvalent isocyanate compound (1) (as 50% by mass of ethyl acetate solution): 15.0 parts
- (Component 4) 65% by mass of solution of dipentaerythritol pentaacrylate (SR-399, manufactured by Sartomer Japan Inc.) in ethyl acetate: 11.54 parts
- (Component 5) 10% solution of sulfonate type surfactant (PIONINE A-41-C, manufactured by TAKEMOTO OIL & FAT Co., Ltd.) in ethyl acetate: 4.42 parts (Water Phase Component)
- Distilled water: 46.87 parts

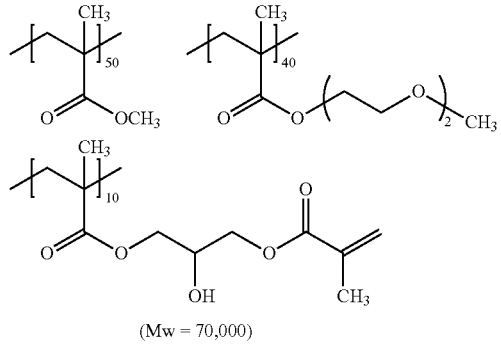

Binder polymer (1)

(Mw = 70,000)

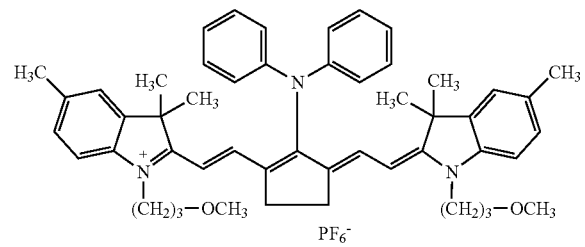

Infrared absorbent (2)

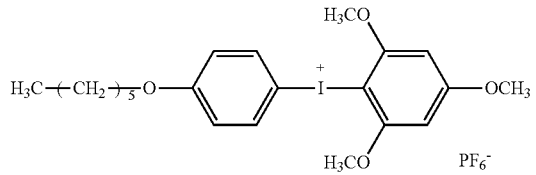

Polymerization initiator (1)

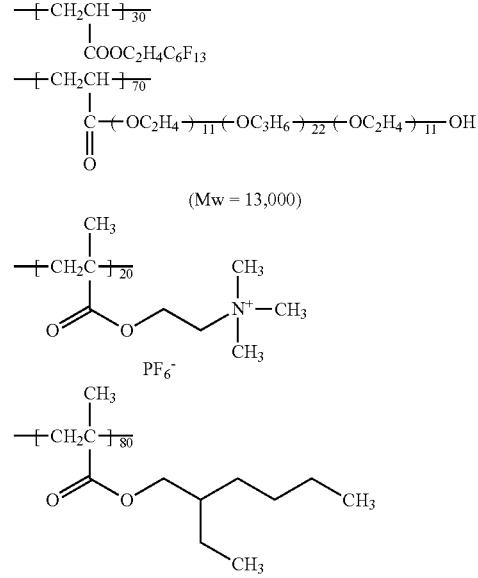

Fluorine-based surfactant (1)

(Mw = 13,000)

Ammonium group-containing polymer

<Image Recording Layer Coating Solution (3)>
- Infrared absorbent (2) [the above structure]: 0.030p
- Irgacure 250[*5]: 0.032 parts
- Polymerizable compound (tris(acryloyloxyethyl) isocyanurate, NK ESTER A-9300, manufactured by Shin-Nakamura Chemical Co., Ltd.): 0.092 parts
- SR-399 (manufactured by Sartomer Japan Inc.): 0.100 parts
- Graft copolymer 3[*8]: 0.825 parts
- BYK306 (manufactured by BYK-Chemie Japan K. K.): 0.008 parts
- 1-methoxy-2-propanol: 8.609 parts
- Methyl ethyl ketone: 1.091 parts
- *8: the graft copolymer 3 is a graft copolymer of poly(ethylene glycol)methyl ether methacrylate, styrene, and acrylonitrile at a mixing ratio of 10:70:20, and a dispersion containing 24% by mass of the polymer particles in a solvent containing n-propanol and water at a mass ratio of 80:20 is used.
- *5: Irgacure 250 is a 75% solution of iodonium, (4-methylphenyl)[4-(2-methylpropyl)phenyl]-, hexafluorophosphate in propylene carbonate that can be procured from Ciba Specialty Chemicals Inc.

<Formation of Protective Layer>

The image recording layer was further coated with a protective layer coating solution (1) having the following composition using a bar coater and dried in an oven at 120° for 60 seconds to form a protective layer having a drying coating amount of 0.15 g/m$^2$, thereby producing a planographic printing plate precursor.

(Protective Layer Coating Solution (1))
- Inorganic layered compound dispersion liquid (1) 1.5 g
- Polyvinyl alcohol (CKS50, manufactured by Nippon Synthetic Chemical Industry Co., Ltd., sulfonic acid-modified, saponification degree: 99% by mole or greater, degree of polymerization: 300) 6% by mass of aqueous solution: 0.55 g
- Polyvinyl alcohol (PVA-405, manufactured by KURARAY CO., LTD., saponification degree: 81.5% by mole, degree of polymerization: 500) 6% by mass of aqueous solution: 0.03 g Surfactant (EMALEX 710, manufactured by Nihon Emulsion Co., Ltd.) 1% by mass of aqueous solution: 0.86 g Ion exchange water: 6.0 g (Preparation of Inorganic Layered Compound Dispersion Liquid (1))

Synthetic mica (SOMASIF ME-100 manufactured by Co-op Chemical Co., Ltd.) (6.4 parts by mass) was added to ion exchange water (193.6 parts by mass) and was dispersed using a homogenizer until the average particle diameter (the laser scattering method) reached 3 μm. The aspect ratio of the obtained dispersed particles was 100 or greater.

<Overcoat Layer Coating Solution>

Water-soluble polymers shown in Tables 1 to 4: amounts shown in Tables 1 to 4 (parts by mass)

Particles shown in Tables 1 to 4: amounts shown in Tables 1 to 4 (parts by mass)

Surfactant (RAPISOL (registered trademark) A-80, manufactured by NOF Corporation): 0.01 parts by mass Water: amount making the total 10 parts by mass The average film thickness of the overcoat layer depended on the number of parts of added water-soluble polymer. For example, in a case where the number of parts of added water-soluble polymer was 0.1 parts, since the coating amount of the water-soluble polymer was 0.1 $g/m^2$, the average film thickness of the overcoat layer was 0.1 μm. In addition, in a case where the number of parts of added water-soluble polymer was 0.05 parts, since the coating amount of the water-soluble polymer was 0.05 $g/m^2$, the average film thickness of the overcoat layer was 0.05 μm. The average film thickness of the overcoat layer was measured by the method described above.

Evaluation

<On-Press Developability>

Each of the obtained planographic printing plate precursors was exposed using Luxel PLATESETTER T-6000III (manufactured by Fujifilm Corporation) equipped with an infrared semiconductor laser under conditions of an external surface drum rotation speed of 1,000 rpm, a laser output of 70%, and a resolution of 2,400 dpi (dot per inch). The exposed image had a solid image and a 50% halftone dot chart of an FM screen having dots with a diameter of 20 μm.

The obtained exposed precursor was attached to a plate cylinder of a printing press LITHRONE26 (manufactured by KOMORI Corporation) without performing a development treatment. After the on-press development was performed by supplying dampening water and ink according to a standard automatic printing start method of the printing press LITHRONE26 (manufactured by KOMORI Corporation) using dampening water in which the volume ratio of Ecolity-2 (manufactured by Fujifilm Corporation) to tap water was 2/98 and Space color fusion G yellow ink (manufactured by DIC Graphics Corporation), printing was performed on 500 sheets of Tokubishi Art (manufactured by Mitsubishi Paper Mills, Ltd., ream weight: 76.5 kg) paper at a printing speed of 10,000 sheets per hour.

The on-press developability was measured based on the number of sheets of printing paper required for the on-press development of the unexposed area of the image recording layer on the printing press to be completed and for the ink not to be transferred to the non-image area. As the number of sheets is smaller, on-press developability is excellent.

Evaluation 1: 100 sheets or more
Evaluation 2: 50 sheets or more and less than 100 sheets
Evaluation 3: 30 sheets or more and less than 50 sheets
Evaluation 4: 20 sheets or more and less than 30 sheets
Evaluation 5: less than 20 sheets <Development Scum-Suppressing Property>

The evaluation of on-press developability was repeated three times using the same planographic printing plate precursor, the development scum adhering to a watered roller in the printing press was transferred to cellophane tape and attached to OK TOPCOAT paper+ (manufactured by Oji Paper Co., Ltd.), and a cyan color density D(C) was measured using a color densitometer X-Rite (manufactured by X-Rite Inc). As the value of the cyan color density D(C) is larger, development scum-suppressing property is excellent.

Evaluation 1: D(C) was lower than 0.1.
Evaluation 2: D(C) was 0.1 or higher and lower than 0.3.
Evaluation 3: D(C) was 0.3 or higher and lower than 0.5.
Evaluation 4: D(C) was 0.5 or higher and lower than 1.0.
Evaluation 5: D(C) was 1.0 or higher.

<Impressing Property (Inking Property in Initial Phase of Printing)>

The planographic printing plate exposed under the same exposure conditions as in the exposure in the above-described evaluation of on-press developability (so that a solid image and a 50% halftone dot chart of a 20 μm-dot FM screen were included in an exposed image) was attached to a plate cylinder of the printing press LITHRONE26 (manufactured by KOMORI Corporation). Printing was started by supplying dampening water and ink according to a standard automatic printing start method of the printing press LITHRONE26 (manufactured by KOMORI Corporation) using dampening water in which the volume ratio of Ecolity-2 (manufactured by Fujifilm Corporation) to tap water was 2/98 and Values-G(N) BLACK INK (manufactured by DIC Graphics Corporation), and then printing was performed on 100 sheets of Tokubishi Art (manufactured by Mitsubishi Paper Mills, Ltd., ream weight: 76.5 kg) paper at a printing speed of 10,000 sheets per hour.

The ink density in a solid image area was measured using a Macbeth densitometer (manufactured by X-Rite Inc., exact), and the number of pieces of printing paper necessary until the ink density reached 1.0 or more was measured as an index of an inking property (inking property in the initial phase of printing). It can be said that, as the number of sheets is smaller, the planographic printing plate has excellent impressing property.

Evaluation 1: 100 sheets or more
Evaluation 2: 50 sheets or more and less than 100 sheets
Evaluation 3: 30 sheets or more and less than 50 sheets
Evaluation 4: 20 sheets or more and less than 30 sheets
Evaluation 5: less than 20 sheets

TABLE 1

|  |  |  |  | Example 1 | Example 2 | Example 3 | Example 4 | Example 5 | Example 6 | Example 7 |
|---|---|---|---|---|---|---|---|---|---|---|
| Overcoat layer | Particles | FS-102 | *P.d.: 80 nm | 0.1 | — | — | — | — | — | — |

TABLE 1-continued

|  |  |  |  | | | | | | | |
|---|---|---|---|---|---|---|---|---|---|---|
| | | EPOSTAR MX020W | *P.d: 20 nm | 0.1 | — | — | — | — | — | — |
| | | EPOSTAR MX030W | *P.d: 40 nm | — | 0.1 | — | — | — | — | — |
| | | EPOSTAR MX050W | *P.d: 70 nm | — | — | 0.1 | — | — | — | — |
| | | EPOSTAR MX100W | *P.d: 150 nm | — | — | — | 0.1 | — | — | — |
| | | WBR-2101 | *P.d: 50 nm | — | — | — | — | — | 0.1 | — |
| | | EPOSTAR SS | *P.d: 100 nm | — | — | — | — | — | — | 0.1 |
| | | NANOBYK3600 | *P.d: 40 nm | — | — | — | — | — | — | — |
| | | SNOWTEX XS | *P.d: 4 nm | — | — | — | — | — | — | — |
| | | SNOWTEX S | *P.d: 8 nm | — | — | — | — | — | — | — |
| | | SNOWTEX XL | *P.d: 40 nm | — | — | — | — | — | — | — |
| | | SNOWTEX PS-S | *P.d: 80 nm | — | — | — | — | — | — | — |
| | | SNOWTEX MP3040 | *P.d: 400 nm | — | — | — | — | — | — | — |
| | Surfactant | RAPISOLA-80 | | 0 | 0 | 0 | 0 | 0 | 0 | 0 |
| Image recording layer | Photosensitive layer 1 (image recording layer coating solution (1)) (g/m²) | | | 1.1 | 1.1 | 1.1 | 1.1 | 1.1 | 1.1 | 1.1 |
| Physical properties of overcoat layer | Contact angle (°) | | | 85 | 85 | 85 | 85 | 85 | 75 | 70 |
| | Occupation area ratio of particles (% by area) | | | 100 | 100 | 100 | 100 | 100 | 100 | 100 |
| | Occupation area ratio (% by area)/ volume average particle diameter (nm) | | | 1.3 | 5.00 | 2.50 | 1.43 | 0.67 | 2.00 | 1.00 |
| Evaluation | On-press developability | | | 3 | 3 | 3 | 3 | 3 | 3 | 3 |
| | Development scum-suppressing property | | | 5 | 5 | 5 | 5 | 4 | 4 | 4 |
| | Impressing property | | | 5 | 5 | 5 | 5 | 5 | 5 | 4 |

| | | | | Example 8 | Example 9 | Example 10 | Example 11 | Example 12 | Example 13 |
|---|---|---|---|---|---|---|---|---|---|
| Overcoat layer | Particles | FS-102 | *P.d.: 80 nm | — | — | — | — | — | — |
| | | EPOSTAR MX020W | *P.d: 20 nm | — | — | — | — | — | — |
| | | EPOSTAR MX030W | *P.d: 40 nm | — | — | — | — | — | — |
| | | EPOSTAR MX050W | *P.d: 70 nm | — | — | — | — | — | — |
| | | EPOSTAR MX100W | *P.d: 150 nm | — | — | — | — | — | — |
| | | WBR-2101 | *P.d: 50 nm | — | — | — | — | — | — |
| | | EPOSTAR SS | *P.d: 100 nm | — | — | — | — | — | — |
| | | NANOBYK3600 | *P.d: 40 nm | 0.1 | — | — | — | — | — |
| | | SNOWTEX XS | *P.d: 4 nm | — | 0.1 | — | — | — | — |
| | | SNOWTEX S | *P.d: 8 nm | — | — | 0.1 | — | — | — |
| | | SNOWTEX XL | *P.d: 40 nm | — | — | — | 0.1 | — | — |
| | | SNOWTEX PS-S | *P.d: 80 nm | — | — | — | — | 0.1 | — |
| | | SNOWTEX MP3040 | *P.d: 400 nm | — | — | — | — | — | 0.1 |
| | Surfactant | RAPISOLA-80 | | 0 | 0 | 0 | 0 | 0 | 0 |
| Image recording layer | Photosensitive layer 1 (image recording layer coating solution (1)) (g/m²) | | | 1.1 | 1.1 | 1.1 | 1.1 | 1.1 | 1.1 |

TABLE 1-continued

| | | | | | | | | |
|---|---|---|---|---|---|---|---|---|
| Physical properties of overcoat layer | Contact angle (°) | | 60 | 60 | 60 | 60 | 60 | 60 |
| | Occupation area ratio of particles (% by area) | | 100 | 100 | 100 | 100 | 100 | 100 |
| | Occupation area ratio (% by area)/ volume average particle diameter (nm) | | 2.50 | 25.0 | 13 | 2.50 | 1.3 | 0.3 |
| Evaluation | On-press developability | | 3 | 3 | 3 | 3 | 3 | 3 |
| | Development scum-suppressing property | | 3 | 5 | 4 | 3 | 3 | 3 |
| | Impressing property | | 3 | 3 | 3 | 3 | 3 | 3 |

*"P.d." represents the particle diameter.

TABLE 2

| | | | | Example No. | | | | | | | | | | |
|---|---|---|---|---|---|---|---|---|---|---|---|---|---|---|
| | | | | 14 | 15 | 16 | 17 | 18 | 19 | 20 | 21 | 22 | 23 | 24 |
| Overcoat layer | Particles | EPOSTAR MX020W | *P.d.: 20 nm | 0.1 | — | — | — | — | — | — | — | 0.1 | — | 0.05 |
| | | EPOSTAR MX030W | *P.d.: 40 nm | — | 0.1 | — | — | — | — | — | — | — | — | — |
| | | EPOSTAR MX050W | *P.d.: 70 nm | — | — | 0.1 | — | — | — | — | — | — | — | — |
| | | EPOSTAR MX100W | *P.d.: 150 m | — | — | — | 0.1 | — | — | — | — | — | — | 0.05 |
| | | WBR-2101 | *P.d.: 50 nm | — | — | — | — | 0.1 | — | — | — | — | — | — |
| | | EPOSTAR SS | *P.d.: 100 m | — | — | — | — | — | 0.1 | — | — | — | — | — |
| | | NANOBYK3600 | *P.d.: 40 nm | — | — | — | — | — | — | 0.1 | — | — | — | — |
| | | SNOWTEX XS | *P.d.: 4 nm | — | — | — | — | — | — | — | 0.1 | — | 0.1 | — |
| | Water-soluble polymer | 60SH-4000 | | 0.1 | 0.1 | 0.1 | 0.1 | 0.1 | 0.1 | 0.1 | 0.1 | — | — | 0.08 |
| | | Luviskol K-17 | | — | — | — | — | — | — | — | — | 0.1 | 0.1 | — |
| | Surfactant | RAPISOL A-80 | | 0 | 0 | 0 | 0 | 0 | 0 | 0 | 0 | 0 | 0 | 0.01 |
| Image recording layer | Photosensitive layer 1 (image recording layer coating solution (1)) (g/m$^2$) | | | 1.1 | 1.1 | 1.1 | 1.1 | 1.1 | 1.1 | 1.1 | 1.1 | 1.1 | 1.1 | 1.1 |
| Physical properties of overcoat layer | Contact angle (°) | | | 80 | 80 | 80 | 80 | 70 | 65 | 50 | 50 | 80 | 50 | 80 |
| | Occupation area ratio of particles (% by area) | | | 62 | 64 | 65 | 78 | 64 | 63 | 67 | 54 | 61 | 53 | 70 |
| | Occupation area ratio (% by area)/ volume average particle diameter (nm) | | | 3.10 | 1.60 | 0.93 | 0.5 | 1.3 | 0.6 | 1.68 | 14 | 3.1 | 13.3 | 0.82 |
| Evaluation | On-press developability | | | 5 | 5 | 5 | 5 | 5 | 5 | 5 | 5 | 5 | 5 | 5 |
| | Development scum-suppressing property | | | 5 | 5 | 5 | 4 | 4 | 3 | 3 | 4 | 5 | 4 | 4 |
| | Impressing property | | | 5 | 5 | 5 | 5 | 4 | 3 | 3 | 3 | 5 | 3 | 5 |

| | | | | Example No. | | | | | | | | | |
|---|---|---|---|---|---|---|---|---|---|---|---|---|---|
| | | | | 25 | 26 | 27 | 28 | 29 | 30 | 31 | 32 | 33 | 34 |
| Overcoat layer | Particles | EPOSTAR MX020W | *P.d.: 20 nm | 0.05 | 0.05 | 0.05 | 0.05 | — | — | — | — | — | — |
| | | EPOSTAR MX030W | *P.d.: 40 nm | — | — | — | — | — | — | — | — | — | — |
| | | EPOSTAR MX050W | *P.d.: 70 nm | — | — | — | — | — | — | — | — | — | — |
| | | EPOSTAR MX100W | *P.d.: 150 m | — | — | — | — | — | — | — | — | — | — |
| | | WBR-2101 | *P.d.: 50 nm | 0.05 | — | — | — | 0.05 | 0.05 | 0.05 | — | — | — |
| | | EPOSTAR SS | *P.d.: 100 m | — | 0.05 | — | — | 0.05 | — | — | 0.05 | 0.05 | — |
| | | NANOBYK3600 | *P.d.: 40 nm | — | — | 0.05 | — | — | 0.05 | — | 0.05 | — | 0.05 |
| | | SNOWTEX XS | *P.d.: 4 nm | — | — | — | 0.05 | | 0.05 | | 0.05 | 0.05 | 0.05 |
| | Water-soluble polymer | 60SH-4000 | | 0.08 | 0.08 | 0.08 | 0.08 | 0.08 | 0.08 | 0.08 | 0.08 | 0.08 | 0.08 |
| | | Luviskol K-17 | | — | — | — | — | — | — | — | — | — | — |
| | Surfactant | RAPISOL A-80 | | 0.01 | 0.01 | 0.01 | 0.01 | 0.01 | 0.01 | 0.01 | 0.01 | 0.01 | 0.01 |

TABLE 2-continued

| | | 1 | 2 | 3 | 4 | 5 | 6 | 7 | 8 | 9 | 10 |
|---|---|---|---|---|---|---|---|---|---|---|---|
| Image recording layer | Photosensitive layer 1 (image recording layer coating solution (1)) (g/m$^2$) | 1.1 | 1.1 | 1.1 | 1.1 | 1.1 | 1.1 | 1.1 | 1.1 | 1.1 | 1.1 |
| Physical properties of overcoat layer | Contact angle (°) | 75 | 73 | 65 | 65 | 68 | 60 | 60 | 58 | 58 | 50 |
| | Occupation area ratio of particles (% by area) | 63 | 63 | 65 | 58 | 64 | 66 | 59 | 65 | 59 | 61 |
| | Occupation area ratio (% by area)/volume average particle diameter (nm) | 1.80 | 1.04 | 2.15 | 4.83 | 0.82 | 1.46 | 2.19 | 0.93 | 1.13 | 2.75 |
| Evaluation | On-press developability | 5 | 5 | 5 | 5 | 5 | 5 | 5 | 5 | 5 | 5 |
| | Development scum-suppressing property | 4 | 4 | 4 | 4 | 3 | 3 | 4 | 3 | 3 | 3 |
| | Impressing property | 5 | 4 | 3 | 3 | 4 | 3 | 3 | 3 | 3 | 3 |

*"P.d." represents the particle diameter.

TABLE 3

| | | | | Example No. | | | | | | | | | |
|---|---|---|---|---|---|---|---|---|---|---|---|---|---|
| | | | | 35 | 36 | 37 | 38 | 39 | 40 | 41 | 42 | 43 | 44 |
| Overcoat layer | Particles | FS-102 | *P.d.: 80 m | 0 | 0.1 | 0.1 | 0.2 | 0.3 | 0.5 | 0 | 0.01 | 0.01 | 0.01 |
| | Water-soluble polymer | 60SH-4000 | | — | — | — | — | — | — | 0.1 | 0.01 | 0.01 | 0.01 |
| | Surfactant | RAPISOL A-80 | | 0 | 0 | 0 | 0 | 0 | 0 | 0 | 0 | 0 | 0 |
| Protective layer | Protective layer coating solution (1) (g/m$^2$) | | | — | — | — | — | — | — | — | — | — | — |
| Image recording layer | Photosensitive layer 1 (image recording layer coating solution (1)) (g/m$^2$) | | | 1.1 | 1.1 | 1.1 | 1.1 | 1.1 | 1.1 | 1.1 | 1.1 | 1.1 | 1.1 |
| | Photosensitive layer 2 (image recording layer coating solution (2)) (g/m$^2$) | | | — | — | — | — | — | — | — | — | — | — |
| | Photosensitive layer 3 (image recording layer coating solution (3)) (g/m$^2$) | | | — | — | — | — | — | — | — | — | — | — |
| Physical properties of overcoat layer | Contact angle (°) | | | 70 | 75 | 85 | 85 | 90 | 95 | 65 | 70 | 75 | 80 |
| | Occupation area ratio of particles (% by area) | | | 30 | 63 | 100 | 100 | 100 | 100 | 31 | 45 | 64 | 73 |
| | Occupation area ratio (% by area)/volume average particle diameter (nm) | | | 0.38 | 0.79 | 1.3 | 1.3 | 1.3 | 1.3 | 0.39 | 0.56 | 0.80 | 0.91 |
| Evaluation | On-press developability | | | 5 | 5 | 3 | 3 | 3 | 3 | 5 | 5 | 5 | 5 |
| | Development scum-suppressing property | | | 3 | 4 | 5 | 5 | 5 | 5 | 3 | 3 | 4 | 5 |
| | Impressing property | | | 4 | 5 | 5 | 5 | 5 | 5 | 3 | 4 | 5 | 5 |

| | | | | Example No. | | | | | | | | |
|---|---|---|---|---|---|---|---|---|---|---|---|---|
| | | | | 45 | 46 | 47 | 48 | 49 | 50 | 51 | 52 | 53 |
| Overcoat layer | Particles | FS-102 | *P.d.: 80 m | 0.2 | 0.3 | 0.5 | 0.08 | 0.08 | 0.5 | 0.5 | 0.08 | 0.08 |
| | Water-soluble polymer | 60SH-4000 | | 0.1 | 0.1 | 0.1 | — | 0.05 | 0.05 | 0.05 | — | 0.05 |
| | Surfactant | RAPISOL A-80 | | 0 | 0 | 0 | 0.01 | 0.01 | 0.01 | 0.01 | 0.01 | 0.01 |
| Protective layer | Protective layer coating solution (1) (g/m$^2$) | | | — | — | — | — | — | 0.15 | — | — | — |
| Image recording layer | Photosensitive layer 1 (image recording layer coating solution (1)) (g/m$^2$) | | | 1.1 | 1.1 | — | — | — | — | — | — | — |
| | Photosensitive layer 2 (image recording layer coating solution (2)) (g/m$^2$) | | | — | — | 1.1 | 1.1 | 1.1 | 1.1 | — | — | — |
| | Photosensitive layer 3 (image recording layer coating solution (3)) (g/m$^2$) | | | — | — | — | — | — | — | 1.1 | 1.1 | 1.1 |
| Physical properties of overcoat layer | Contact angle (°) | | | 85 | 85 | 90 | 85 | 75 | 90 | 90 | 85 | 75 |
| | Occupation area ratio of particles (% by area) | | | 82 | 91 | 97 | 100 | 65 | 97 | 97 | 100 | 65 |
| | Occupation area ratio (% by area)/volume average particle diameter (nm) | | | 1.03 | 1.14 | 1.21 | 1.25 | 0.81 | 1.21 | 1.21 | 1.25 | 0.81 |

TABLE 3-continued

| | | | | | | | | | | |
|---|---|---|---|---|---|---|---|---|---|---|
| Evaluation | On-press developability | 5 | 4 | 3 | 3 | 5 | 3 | 3 | 3 | 5 |
| | Development scum-suppressing property | 5 | 5 | 5 | 5 | 4 | 5 | 5 | 5 | 4 |
| | Impressing property | 5 | 5 | 5 | 5 | 5 | 5 | 5 | 5 | 5 |

*"P.d." represents the particle diameter.

TABLE 4

| | | | Comparative Example 1 | Comparative Example 2 | Comparative Example 3 | Comparative Example 4 |
|---|---|---|---|---|---|---|
| Overcoat layer | Particles | FS-102 Particle diameter: 80 nm | — | — | — | 0.01 |
| | Water-soluble polymer | 60SH-4000 | 1 | — | — | — |
| | | PVA405 (KURARAY) | — | — | 1 | — |
| | Surfactant | RAPISOLA-80 | 0.01 | — | — | 0.01 |
| Image recording layer | Photosensitive layer 1 (image recording layer coating solution (1)) (g/m$^2$) | | — | 1.1 | — | 1.1 |
| | Photosensitive layer 2 (image recording layer coating solution (2)) (g/m$^2$) | | 1.1 | — | — | — |
| | Photosensitive layer 3 (image recording layer coating solution (3)) (g/m$^2$) | | — | — | 1.1 | — |
| Physical properties of overcoat layer | Contact angle (°) | | 30 | 50 | 50 | 60 |
| | Occupation area ratio of particles (% by area) | | 0 | 0 | 0 | 10 |
| | Occupation area ratio (% by area)/volume average particle diameter (nm) | | 0.00 | 0.00 | 0 | 0.13 |
| | On-press developability | | 2 | 5 | 5 | 5 |
| Evaluation | Development scum-suppressing property | | 5 | 1 | 1 | 1 |
| | Impressing property | | 1 | 5 | 5 | 2 |

The particle diameters shown in Tables 1 to 4 represent volume average particle diameters. In addition, the numerical values of each component in Examples and Comparative Examples shown in Tables 1 to 4 represent parts by mass.

The physical properties (volume average particle diameter, contact angle, and occupation area ratio) of particles and overcoat layers in Tables 1 to 4 were measured by the methods described above.

In addition, details of each compound shown in Tables 1 to 4 other than those described above are shown below,
- FS-102: acrylic resin particles (styrene acrylic resin particles), volume average particle diameter: 80 nm, manufactured by NIPPONPAINT Co., Ltd.
- EPOSTAR MX020 W: acrylic resin particles, volume average particle diameter: 20 nm, manufactured by NIPPON SHOKUBAI CO., LTD.
- EPOSTAR MX030 W: acrylic resin particles, volume average particle diameter: 40 nm, manufactured by NIPPON SHOKUBAI CO., LTD.
- EPOSTAR MX050 W: acrylic resin particles, volume average particle diameter: 50 nm, manufactured by NIPPON SHOKUBAI CO., LTD.
- EPOSTAR MX100 W: acrylic resin particles, volume average particle diameter: 150 nm, manufactured by NIPPON SHOKUBAI CO., LTD.
- WBR-2101: urethane resin particles, volume average particle diameter: 50 nm, manufactured by Taisei Fine Chemical Co., Ltd.
- EPOSTAR SS: melamine resin particles, volume average particle diameter: 100 nm, manufactured by NIPPON SHOKUBAI CO., LTD.
- NANOBYK3600: alumina particles, volume average particle diameter: 40 nm, manufactured by BYK-Chemie Japan K. K.
- SNOWTEX (registered trademark) XS: silica particles, volume average particle diameter: 4 nm, manufactured by NIPPON SHOKUBAI CO., LTD.
- SNOWTEX (registered trademark) S: silica particles, volume average particle diameter: 8 nm, manufactured by NIPPON SHOKUBAI CO., LTD.
- SNOWTEX (registered trademark) XL: silica particles, volume average particle diameter: 40 nm, manufactured by NIPPON SHOKUBAI CO., LTD.
- SNOWTEX (registered trademark) PS-S: silica particles, volume average particle diameter: 80 nm, manufactured by NIPPON SHOKUBAI CO., LTD.
- SNOWTEX (registered trademark) MP3040: silica particles, volume average particle diameter: 400 nm, manufactured by NIPPON SHOKUBAI CO., LTD.
- 60SH-4000: hydroxypropyl methyl cellulose, water-soluble polymer, manufactured by Shin-Etsu Chemical Co., Ltd.
- Luviskol K-17: polyvinylpyrrolidone water-soluble polymer, manufactured by BASF
- RAPISOL (registered trademark) A-80: anionic surfactant, manufactured by NOF Corporation As is clear from the results of Tables 1 to 4, compared with Comparative Example, it is found that the planographic printing plate precursor according to the embodiment of the present disclosure has excellent impressing property and development scum-suppressing property.

In addition, it is found that the planographic printing plate precursor according to the embodiment of the present disclosure has excellent on-press developability.

The disclosure of JP2018-015174 filed on Jan. 31, 2018 is incorporated in the present specification by reference.

All documents, patent applications, and technical standards described in the present specification are incorporated herein by reference to the same extent as in a case of being specifically and individually noted that individual documents, patent applications, and technical standards are incorporated by reference.

What is claimed is:

1. A planographic printing plate precursor comprising:
an image recording layer on a support; and
an overcoat layer in this order,
wherein the overcoat layer includes particles,
the overcoat layer is an outermost layer,
an occupation area ratio of the particles in a surface of the overcoat layer is 30% by area or more;
a volume average particle diameter of the particles is less than 0.2 μm;
the image recording layer comprises an infrared absorbent, a polymerizable compound, and a polymerization initiator, and
wherein the particles are at least one kind of particle selected from the group consisting of acrylic resin particles, styrene acrylic resin particles, silica particles, alumina particles, and urethane resin particle.

2. The planographic printing plate precursor according to claim 1,
wherein the overcoat layer further includes a water-soluble polymer.

3. The planographic printing plate precursor according to claim 1,
wherein the particles are water-dispersible particles.

4. The planographic printing plate precursor according to claim 1,
wherein a volume average particle diameter of the particles is smaller than 0.1 μm.

5. The planographic printing plate precursor according to claim 1,
wherein a volume average particle diameter of the particles is smaller than an average film thickness of the overcoat layer.

6. The planographic printing plate precursor according to claim 1,
wherein the particles are at least one kind of particle selected from the group consisting of acrylic resin particles and styrene acrylic resin particles.

7. The planographic printing plate precursor according to claim 1,
wherein the planographic printing plate precursor is a planographic printing plate precursor for on-press development.

8. The planographic printing plate precursor according to claim 1, wherein the overcoat layer further includes a water-soluble polymer, wherein the water-soluble polymer includes at least one selected from the group consisting of a structure including a hydroxy group, a structure including a pyrrolidone ring, and a structure including an oxyalkylene group, as a repeating unit.

9. The planographic printing plate precursor according to claim 1, wherein the image recording layer includes an infrared absorbent, a polymerization initiator, a polymerizable compound, and a polymer compound having a particle shape including a polymerizable group as a thermally reactive group.

10. A method of producing a planographic printing plate, comprising:
a step of image-wise exposing the planographic printing plate precursor according to claim 1 to form an exposed area and an unexposed area; and
a step of supplying at least one of printing ink or dampening water to remove a non-image area.

11. A method of producing a planographic printing plate comprising:
an exposure step of image-wise exposing the planographic printing plate precursor according to claim 1 to form an exposed area and an unexposed area; and
a development step of supplying a developer having a pH of 2 or higher and 11 or lower to remove the unexposed area.

* * * * *